United States Patent
Irons et al.

(10) Patent No.: US 11,095,081 B2
(45) Date of Patent: Aug. 17, 2021

(54) POWER DISTRIBUTION UNIT SYSTEM INCORPORATING SMART CABLES AND ADAPTERS

(71) Applicant: Server Technology, Inc., Reno, NV (US)

(72) Inventors: Travis Irons, Reno, NV (US); Peter Giammona, Reno, NV (US); James P. Maskaly, Reno, NV (US); Vimalkumar Bhakta, Reno, NV (US); Mark Ramsey, Reno, NV (US)

(73) Assignee: SERVER TECHNOLOGY, INC., Reno, NV (US)

(*) Notice: Subject to any disclaimer, the term of this patent is extended or adjusted under 35 U.S.C. 154(b) by 0 days.

(21) Appl. No.: 16/356,646

(22) Filed: Mar. 18, 2019

(65) Prior Publication Data

US 2019/0372283 A1  Dec. 5, 2019

Related U.S. Application Data

(60) Division of application No. 15/497,063, filed on Apr. 25, 2017, now Pat. No. 10,236,648, which is a continuation-in-part of application No. 15/169,940, filed on Jun. 1, 2016, now Pat. No. 10,517,188.

(51) Int. Cl.
*H01R 25/00* (2006.01)
*H01R 25/16* (2006.01)
*H05K 7/14* (2006.01)

(52) U.S. Cl.
CPC ......... *H01R 25/165* (2013.01); *H05K 7/1492* (2013.01)

(58) Field of Classification Search
CPC .............................. H05K 7/1491; H01R 25/165
See application file for complete search history.

(56) References Cited

U.S. PATENT DOCUMENTS

| | | |
|---|---|---|
| 5,913,487 A | 6/1999 | Leatherman |
| 6,077,108 A | 6/2000 | Lorscheider et al. |
| 7,043,543 B2 | 5/2006 | Ewing et al. |
| 7,099,934 B1 | 8/2006 | Ewing et al. |
| 7,127,144 B2 * | 10/2006 | Lee ........................ H01B 9/005 385/101 |
| 7,365,964 B2 | 4/2008 | Donahue |
| 7,905,749 B2 | 3/2011 | Cleveland |
| 8,004,827 B2 | 8/2011 | Ewing et al. |
| 8,305,737 B2 | 11/2012 | Ewing et al. |
| 8,321,163 B2 | 11/2012 | Ewing et al. |
| 8,494,661 B2 | 7/2013 | Ewing et al. |
| 8,541,906 B2 | 9/2013 | Ewing et al. |
| 8,587,950 B2 | 11/2013 | Ewing et al. |

(Continued)

*Primary Examiner* — Pete T Lee
(74) *Attorney, Agent, or Firm* — Perkins Coie LLP

(57) ABSTRACT

An adapter for interconnecting a power distribution unit (PDU) to electrical equipment. The adapter can include a first connector mateable with an outlet of the PDU and a second connector in electrical communication with the first connector. The second connector is mateable with a power input of the electrical equipment. PDU interface circuitry incorporating an optical interface can be housed in the first connector for communicating one or more electrical parameters of the electrical equipment to the PDU when the first connector is mated with the outlet of the PDU.

28 Claims, 33 Drawing Sheets

(56) References Cited

U.S. PATENT DOCUMENTS

| | | | |
|---|---|---|---|
| 8,876,548 B2* | 11/2014 | Doorhy | H05K 7/1457 |
| | | | 174/53 |
| 2008/0093927 A1 | 4/2008 | Ewing et al. | |
| 2009/0236909 A1* | 9/2009 | Aldag | H01R 25/142 |
| | | | 307/39 |
| 2013/0089290 A1* | 4/2013 | Sloey | G02B 6/389 |
| | | | 385/74 |
| 2014/0236372 A1* | 8/2014 | Ewing | H04L 12/10 |
| | | | 700/295 |
| 2016/0161531 A1 | 6/2016 | Avery | |
| 2017/0184798 A1* | 6/2017 | Coenegracht | G02B 6/3849 |

* cited by examiner

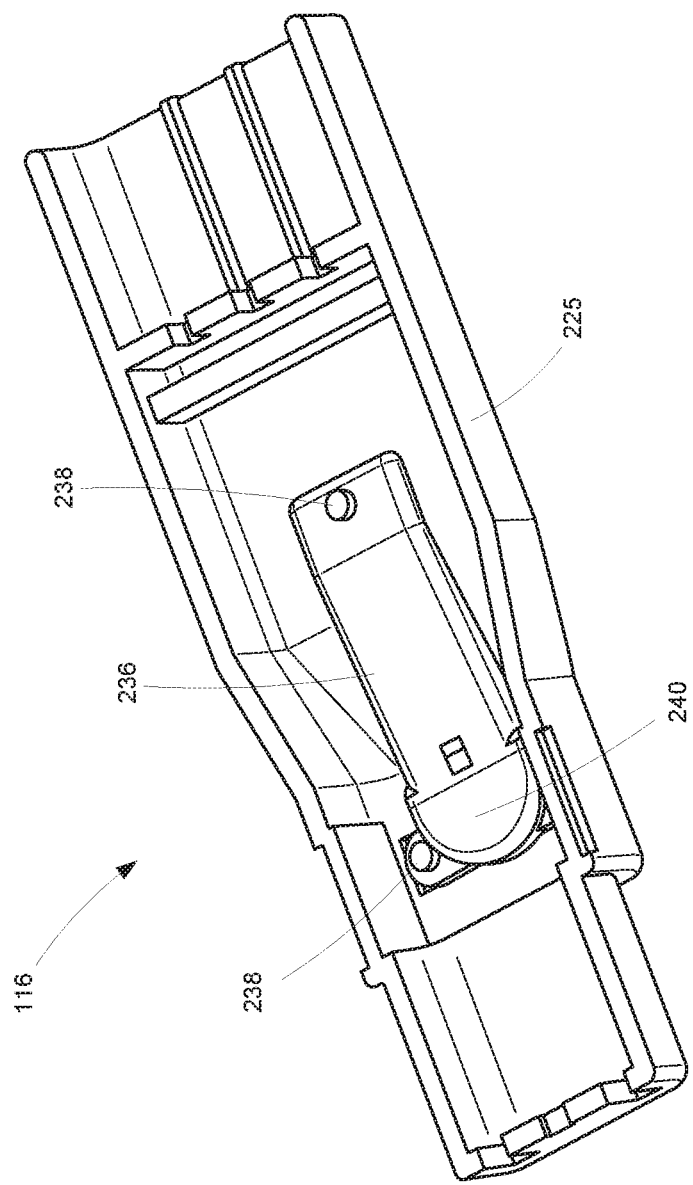

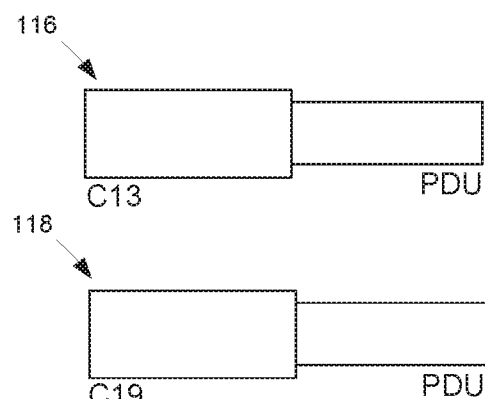
FIG.24A
FIG.24B
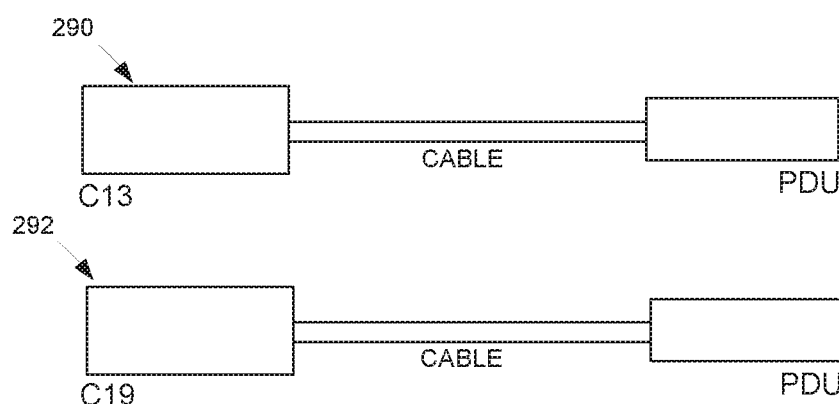
FIG.24C
FIG.24D

POWER DISTRIBUTION UNIT SYSTEM INCORPORATING SMART CABLES AND ADAPTERS

CROSS-REFERENCE TO RELATED APPLICATIONS

This application is a division of U.S. patent application Ser. No. 15/497,063, entitled "Power Distribution Unit System Incorporating Smart Cables and Adapters," filed Apr. 25, 2017, which is a continuation-in-part of U.S. patent application Ser. No. 15/169,940, entitled "Power Distribution Unit with Cord Storage Cartridge," filed Jun. 1, 2016, the disclosures of which are hereby incorporated by reference in their entirety.

TECHNICAL FIELD

The present disclosure is directed to power distribution devices and, more specifically, to power distribution unit systems capable of providing a high density of outlets that are adaptable to varying plug types and providing modular intelligence for outlet monitoring and switching.

BACKGROUND

A conventional Power Distribution Unit (PDU) is an assembly of electrical outlets (also called receptacles) that receive electrical power from a source and distribute the electrical power to one or more separate pieces of electronic equipment having respective power cords plugged into respective outlets of the PDU. PDUs are used in many applications and settings such as, for example, in or on electronic equipment racks. One or more PDUs are commonly located in an equipment rack (or other cabinet), and may be installed together with other devices connected to the PDU such as environmental monitors, temperature and humidity sensors, fuse modules, or communications modules that may be external to or contained within the PDU housing. A PDU that is mountable in an equipment rack or cabinet may sometimes be referred to as a Cabinet PDU or CDU for short.

A common use of PDUs is supplying operating power for electrical equipment in computing facilities, such as enterprise data centers, multi-tenant hosting environments like colocation facilities, cloud computing, and other data center types. Such computing facilities may include electronic equipment racks that comprise rectangular or box-shaped housings, sometimes referred to as a cabinet or a rack, and associated components for mounting equipment, associated communications cables, and associated power distribution cables. Electronic equipment may be mounted in such racks so that the various electronic devices (e.g., network switches, routers, servers and the like) are aligned vertically, one on top of the other, in the rack. Multiple PDUs may be used to provide power to the electronic equipment where redundant configurations are required. Multiple racks may be oriented side-by-side, with each containing numerous electronic components and having substantial quantities of associated component wiring located both within and outside of the area occupied by the racks.

As will be readily recognized, space within equipment racks is valuable, with maximization of computing resources for any given volume being desirable. Therefore, it is desirable to ensure that the components within the equipment rack have maximum up-time. To accomplish this, many components include redundant power supplies connected to redundant PDUs in order to reduce the possibility that equipment will go down due to lack of power. Redundant PDUs require twice the number of power cables as compared to single PDU configurations. Accordingly, management of the associated power distribution cables can become problematic.

SUMMARY

The evolution of computing equipment is toward higher electrical efficiency and smaller volume, resulting in higher densities of computing equipment within a rack that requires at least an equivalent number of power outputs. For this reason, a PDU that provides the necessary number of power outputs while also reducing the area occupied by the PDU housing and associated power distribution cables is commercially advantageous. Furthermore, a PDU that allows for the shortest cables and the least number of different cable lengths can provide additional advantages over conventional PDUs. For example, shorter cables can facilitate increased cooling air flow to the components in a rack and simplifies the replacement of cables and the components themselves. In addition, reducing the number of different lengths of cables can simplify purchasing and management of different power cables for an enterprise.

Apparatuses, devices, systems, and methods are provided in the present disclosure that maximizes the number of power outputs (e.g., outlet connectors) available on a PDU, while also providing for flexibility in connecting to different plug types and minimizing cord lengths and the number of different cord lengths. Different pieces of equipment may have different power needs requiring different power cords having different plugs to support different power ampacities. In some aspects, a PDU according to a representative embodiment includes an elongate PDU housing having opposed front and rear panels with a plurality of side panels extending therebetween. The front panel can have a width between about 1.7 inches and about 3.0 inches. In some embodiments, the front panel includes an outlet region extending along a length of the PDU and a non-outlet region positioned side-by-side with the outlet region. In some embodiments, the outlet region can have a width less than about 0.83 inches. A plurality of outlet cores are arranged along the length of the outlet region of the front panel, wherein the outlet region includes a plurality of apertures each corresponding to an associated one of the plurality of outlet cores.

In another representative embodiment, a PDU includes an elongate housing having an outlet panel extending along a length of the PDU and a non-outlet panel parallel to and offset from the outlet panel. A power input is coupled with the PDU housing and is connectable to an external power source. One or more PCBs can be mounted within the housing and electrically interconnected to the power input. A plurality of outlet cores are arranged along the outlet panel preferably with 1 U spacing and mounted to the one or more PCBs with an unobstructed space between adjacent pairs of the plurality of outlet cores. In some embodiments, the outlet cores each extend a portion of the distance between the one or more PCBs and the outlet panel. The outlet panel can include a plurality of apertures each corresponding to an associated one or more of the plurality of outlet cores. In some embodiments, one or more circuit protection devices, such as circuit breakers, are mounted in the non-outlet panel and aligned along the length of the housing.

In some aspects, a smart cable for removable attachment to a PDU, according to a representative embodiment, includes a connector housing configured to removably connect the smart cable to a mateable interface of a PDU. A power output cable extends into the connector housing at one end and couples to an output connector at the opposite end. A PDU interface is disposed in the connector housing and can include a unique identifier encoded in a memory device, a sensing device configured to sense at least one power-related parameter of the power output cable, and an optical signal interface. The optical signal interface is configured to report the at least one power-related parameter and the unique identifier to the PDU. In some embodiments, smart cables can include additional sensors, for example and without limitation, temperature sensors, differential pressure sensors, humidity sensors, air flow sensors, water detection sensors, and electrical (on/off) switches, which can be used to detect access into computer equipment racks. In some embodiments, indicia corresponding to the unique identifier is attached to the power output cable. In some embodiments, the PDU interface is configured to read a unique identifier stored on an identifier tag, for example.

In some aspects, a power connector adapter, according to a representative embodiment, includes a first connector configured to mate with an industry standard connector (e.g., IEC C2, C4, C6, C8, C10, C12, C14, C16, C16A, C18, C20, C22, C24 or NEMA 5-15R, 6-20R, 6-30R, 6-50R) and a second connector configured to mate with a non-industry standard connector. In various embodiments, industry standard connectors can include connectors defined in International Electro technical Commission (IEC) standard publication IEC60320 as of the filing date of the present application. In some embodiments, the non-industry standard connector includes at least three aligned terminals. A plurality of electrical conductors extend between the first connector and the second connector. In some embodiments, a first attachment mechanism is associated with the first connector and a second attachment mechanism is associated with the second connector. The second attachment mechanism can be movable from a secured state, in which said attachment mechanism can retainably couple the power connector adapter to a PDU, to an unsecured state to allow removal of the power connector adapter from the PDU.

The foregoing broadly outlines the features and technical advantages of examples according to the disclosure in order that the detailed description that follows may be better understood. Additional features and advantages will be described hereinafter. The concepts and specific examples disclosed herein may be readily used as a basis for modifying or designing other structures for carrying out the same purposes of the present disclosure. Such equivalent constructions do not depart from the spirit and scope of the appended claims. Features which are believed to be characteristic of the concepts disclosed herein, both as to their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present technology may be realized by reference to the following drawings. In the appended figures, similar components or features may have the same reference label.

FIG. 16 is an isometric view illustrating a connector adapter cover according to a representative embodiment;

FIGS. 24A-24D diagrammatically illustrate various representative embodiments of power connector adapters which are contemplated by the present disclosure;

DETAILED DESCRIPTION

Figure 1A:
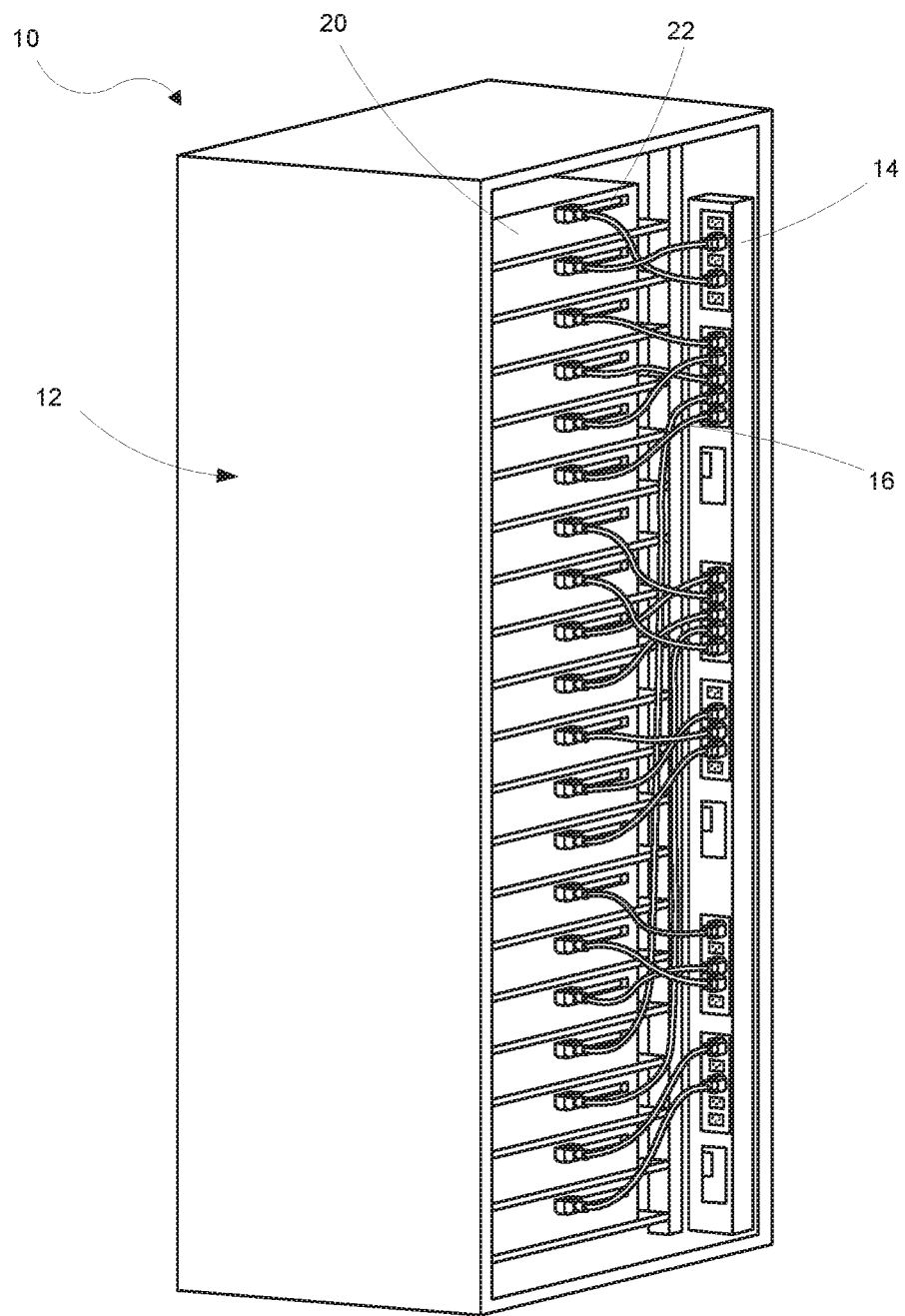
FIG. 1A is an isometric view of a conventional equipment rack system.

Systems, methods and devices are provided that allow for efficient and flexible distribution of power to equipment located, for example, in an electrical equipment rack. Aspects of the present disclosure provide PDUs with the necessary number of power outputs while also reducing the volume occupied by the PDU housing and associated power distribution cables. Furthermore, the disclosed PDU configurations allow for the shortest cables and the least number of different cable lengths providing additional advantages over conventional PDUs. Aspects of the present disclosure also provide power connector adapters for connecting industry standard connectors of electrical equipment with non-industry standard connectors of the disclosed PDUs. Other aspects of the present disclosure further provide smart cables for connecting electrical equipment to the disclosed PDUs. In some embodiments, the smart cables are configured to provide various capabilities such as outlet switching, report power-related information about the electrical equipment, and read and/or store a unique identifier and report the identifier to the PDU. The unique identifier can be used to track the electrical equipment.

The disclosed power distribution unit system incorporating smart cables and adapters includes a basic PDU and configurable smart cables that can be connected to the PDU and equipment as needed. Each smart cable can be configured as needed with various features, such as switching, metering, and asset tracking, for example. Accordingly, only one or a limited number of PDU variations (e.g., different numbers of outlets) need be stocked in inventory to satisfy most if not all customer configuration demands. Similarly, only one or a few smart cable variations (e.g., different connectors) need be stocked in order to meet various configuration demands. Thus, manufacturing costs can be reduced due to economies of scale and reduced inventory requirements. Similarly, the customer can reduce the number of items they are required to keep on hand for replacements.

The smart cable can be easily reconfigured and/or upgraded with software changes when equipment is upgraded, replaced, or when application configurations change. The disclosed connector adapters further facilitate adapting to configuration changes where connector types (e.g., C13 or C19) change. The disclosed power distribution unit system incorporating smart cables and adapters can also improve serviceability. If a smart cable fails, only that cable need be replaced, rather than the entire PDU as is the case with conventional PDU configurations. Replacing only the smart cable is more cost effective and less time consuming as well. Because most of the circuitry is in the smart cable, the PDU is less likely to fail and if it does it is less expensive to replace than a full featured PDU.

This description provides examples, and is not intended to unnecessarily limit the scope, applicability, or configuration of the inventions herein. Rather, the ensuing description will provide those skilled in the art with an enabling description for implementing embodiments of the inventions. Various changes may be made in the function and arrangement of elements. Thus, various embodiments may omit, substitute, or add various procedures or components as appropriate. For instance, aspects and elements described with respect to certain embodiments may be combined in various other embodiments. It should also be appreciated that the following systems, devices, and components may individually or collectively be components of a larger system, wherein other procedures may take precedence over or otherwise modify their application.

The following patents and patent applications are incorporated herein by reference in their entirety: U.S. Pat. No. 7,043,543, entitled "Vertical-Mount Electrical Power Distribution Plugstrip," issued on May 9, 2006; U.S. Pat. No. 7,990,689, entitled "Power Distribution Unit And Methods Of Making And Use Including Modular Construction And Assemblies," issued on Aug. 2, 2011; U.S. Pat. No. 8,494,661, entitled "Power Distribution, Management, and Monitoring Systems," and issued on Jul. 23, 2013; U.S. Pat. No. 8,321,163, entitled "Monitoring Power-Related Parameters in a Power Distribution Unit," and issued on Nov. 27, 2012; U.S. Pat. No. 8,541,906, entitled "Polyphase Power Distribution and Monitoring Apparatus," and issued on Sep. 24, 2013; U.S. Pat. No. 8,305,737, entitled "Power Distribution Apparatus With Input and Output Power Sensing and Method of Use," and issued on Nov. 6, 2012; U.S. Pat. No. 8,587,950, entitled "Method and Apparatus for Multiple Input Power Distribution to Adjacent Outputs," and issued on Nov. 19, 2013; and U.S. application Ser. No. 14/959,207, entitled "Magneto-Resistive Sensor Device and Magnetic Bias Regulator Circuit, Along With Systems And Methods Incorporating Same," and filed on Dec. 4, 2015.

Figure 1B:
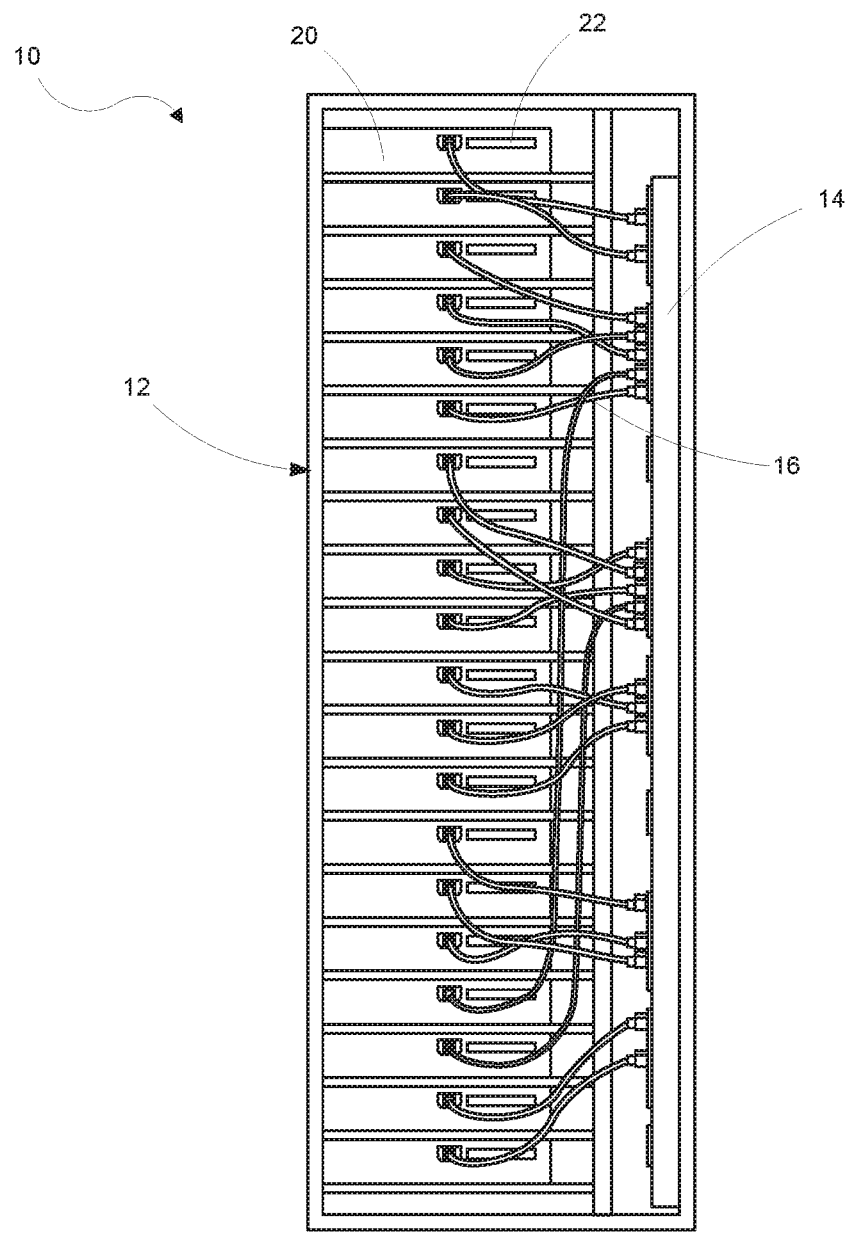
FIG. 1B is a rear view in elevation of the conventional equipment rack system shown in FIG. 1A.

FIGS. 1A and 1B illustrate a conventional equipment rack system 10. The equipment rack system 10 includes an equipment cabinet 12 and electronic equipment 20 mounted in the equipment cabinet 12. The electronic equipment 20 may include various electronic devices, such as network switches, routers, servers and the like. A conventional PDU 14 is also mounted within the equipment cabinet 12. The conventional PDU 14 has a predetermined number of outlets of a certain type, which are spaced at predetermined intervals along the PDU 14. FIGS. 1A and 1B illustrate PDUs having 30 outlets, but PDUs can have any suitable number of outlets of various types. Separate power cords 16 connect the outlets of the PDU 14 to the electronic equipment 20. Many specific lengths of power cords 16 need to be used to keep the power cords 16 organized and to maintain proper airflow around the equipment cabinet 12.

When changing or removing electronic equipment 20 from the equipment cabinet 12, the corresponding power cords 16 need to be located and unplugged. Due to the bundling of the power cords 16, locating and removing the necessary cords may be time-consuming and difficult. Furthermore, when adding electronic equipment 20 to the equipment cabinet 12, the conventional PDU 14 may not have available outlets near the location of the electronic equipment 20. In these cases, longer power cords 16 may need to be used to connect the electronic equipment 20 to the available outlets. These longer power cords 16 may cause the electronic equipment 20 to be more difficult to access and may impact the airflow around the equipment cabinet 12. The conventional PDU 14 may also not have outlets of the correct type for connecting different electronic equipment 20. In these cases, an outlet adapter or a different PDU may be necessary in order to connect the electronic equipment 20.

Figure 1C:
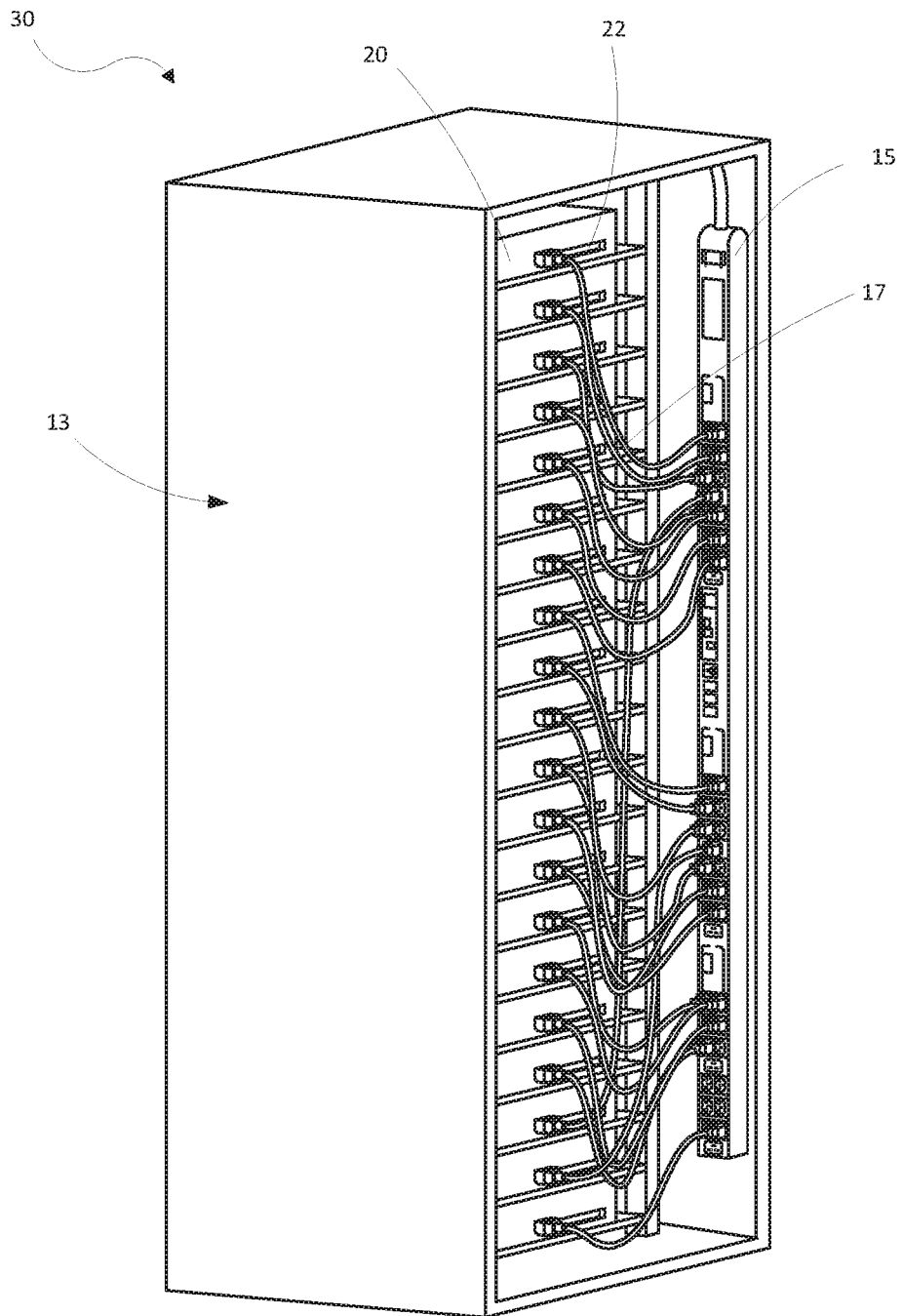
FIG. 1C is an isometric view of a conventional equipment rack system.
Figure 1D:
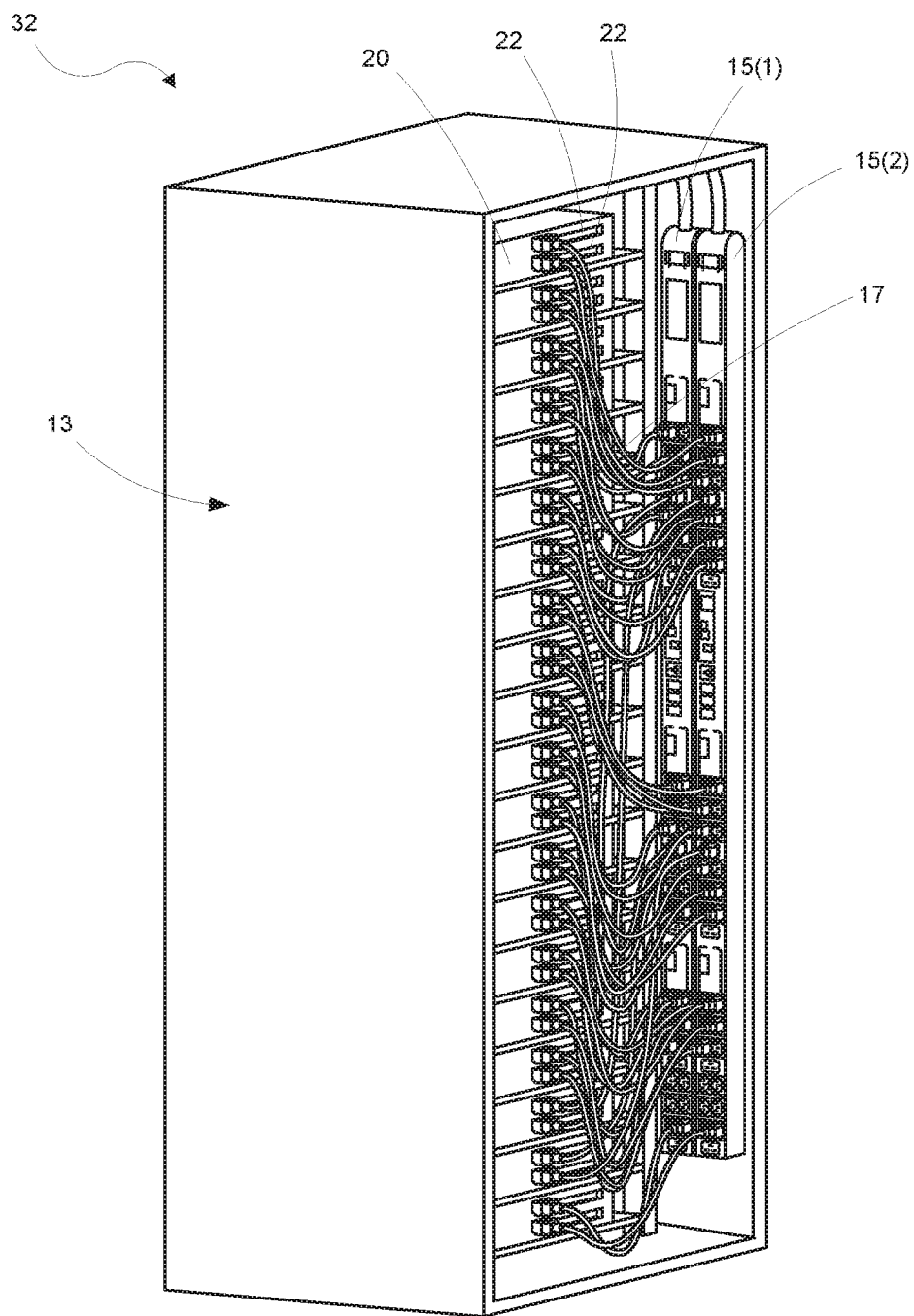
FIG. 1D is an isometric view of another conventional equipment rack system having two PDUs positioned side by side.

FIG. 1C illustrates another conventional equipment rack system 30 having a conventional PDU 15 and electronic equipment 20 positioned in an equipment cabinet 13. Power cords 17 connect the power supplies 22 to the PDU 15. FIG. 1D illustrates a conventional equipment rack system 32 having two conventional PDUs 15(1) and 15(2) (PDUs 15 collectively) positioned side by side in an equipment cabinet 13. The equipment rack system 32 includes electronic equipment 20 mounted in the equipment cabinet 13. Each piece of electronic equipment 20 can include two redundant power supplies 22, each of which is connected to one of the two PDUs 15. Separate power cords 17 connect the power supplies to the PDUs 15. As with the conventional equipment rack system 10 described above with respect to FIGS. 1A and 1B, when changing or removing electronic equipment 20 from the equipment cabinet 13, the corresponding power cords 17 need to be located and unplugged, which may be time-consuming and difficult. However, in this case the process is further complicated by having two PDUs.

Figure 2A:
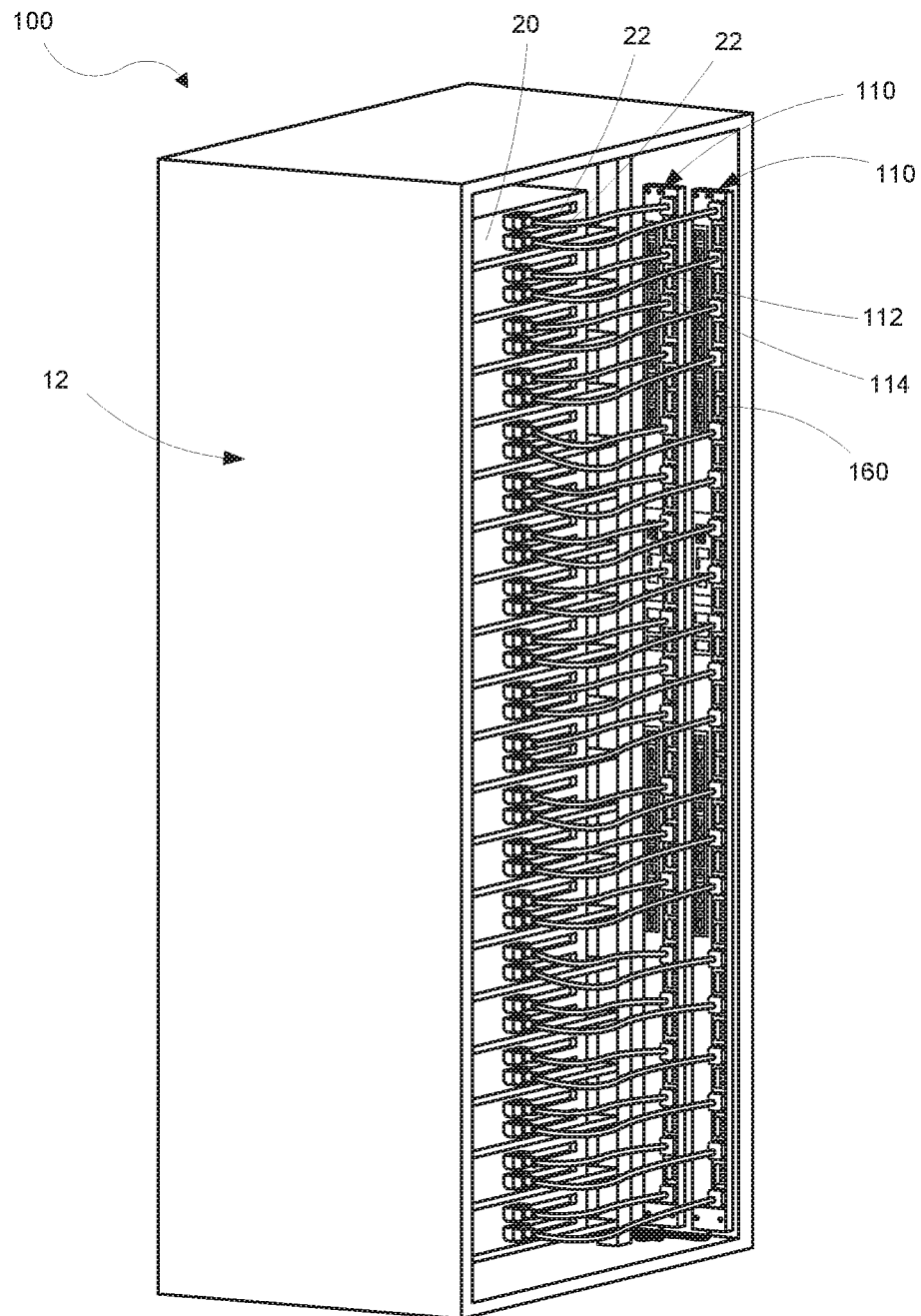
FIG. 2A is an isometric view of a representative embodiment of an equipment rack system that includes two PDUs in accordance with various aspects of the present disclosure.
Figure 2B:
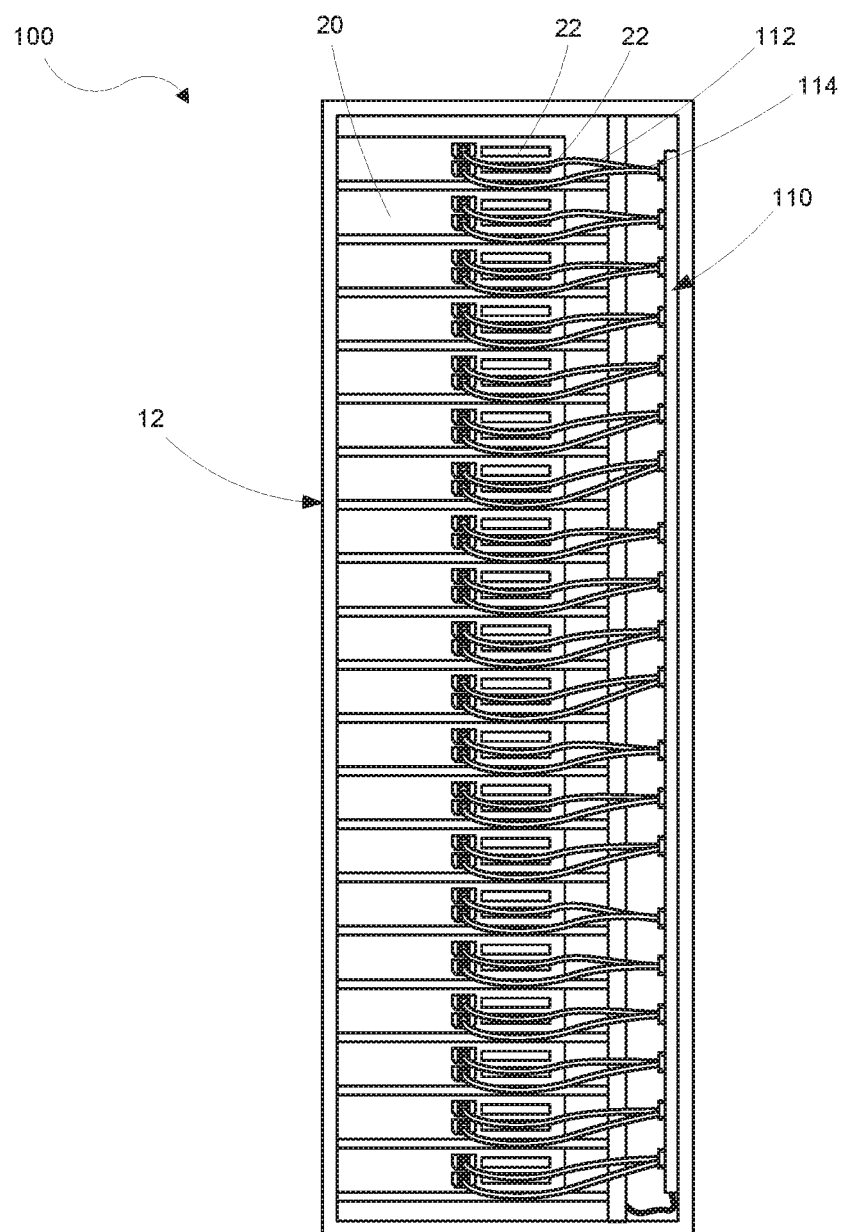
FIG. 2B is a rear view in elevation of the equipment rack system shown in FIG. 2A.

FIGS. 2A and 2B illustrate an embodiment of an equipment rack system 100 that includes a pair of PDUs 110 each configured in accordance with an embodiment of the present technology. The PDUs 110 overcome the problems of the conventional PDU 14 described in reference to FIGS. 1A and 1B, and also provides additional benefits, as further described herein. The equipment rack system 100 includes an equipment cabinet 12 and electronic equipment 20 mounted in the equipment cabinet 12. The electronic equipment 20 may include various electronic devices, such as network switches, routers, servers and the like. The PDUs 110 are also mounted within the equipment cabinet 12. As explained more fully below, each PDU 110 includes a plurality of outlet connectors 160 configured to allow a spacing of one rack unit (1 U) between outlets. In addition, the outlet connectors 160 allow the PDU 110 to have a width narrower than conventional PDU designs. This is due, at least in part, to their narrower form factor and orientation within the PDU 110. In certain implementations a customer might need to place PDUs on both sides of the rack due to space limitations within the rack. The disclosed PDUs with their approximate 1 U spacing allow that customer to place two PDUs on the same side of the rack. The combination of 1 U outlet spacing with side-by-side PDU mounting is not available with conventional PDU designs. The narrower widths of the PDUs 110 also allow two PDUs to be mounted side by side in a shallower equipment cabinet than that required with conventional PDUs, such as those illustrated in FIG. 1D. Furthermore, the narrower widths of the PDUs 110 allow two PDUs to be mounted side by side in an equipment cabinet using industry standard mounting features (e.g., keyhole mounting apertures) typically spaced approximately 2.2 inches apart.

As can be appreciated in FIGS. 2A and 2B, only two different length power cords 112 and 114 are needed to connect all of the electronic equipment's power supplies 22 to the PDUs 110. Furthermore, because two outlets are available at each rack unit location, the power cords 112 and 114 can extend straight across (i.e., horizontally) from each power supply 22 to a corresponding outlet on one of the PDUs 110. In some embodiments, the power cords 112 and 114 can include industry standard connectors such as any of various IEC type connectors (e.g., IEC C13/C14 or IEC C19/C20). Appropriate power cords can be connected at one end to the electronic equipment 20 and connected at the other end to a corresponding PDU 110 via a power connector adapter, for example. It should be appreciated that the PDUs depicted in FIG. 2A each have 42 receptacles while the conventional PDU shown in FIG. 1C has only 24 receptacles. A conventional PDU having 42 receptacles would need to be considerably wider (if the length remains fixed) in order to support this number of outlets. It should be understood that the electronic equipment depicted in the figures is intended to be a representation of such equipment and that variations to the appearance and layout of the equipment's features can vary. For example, the power supplies could be on one side or the other of the equipment.

Figure 3A:
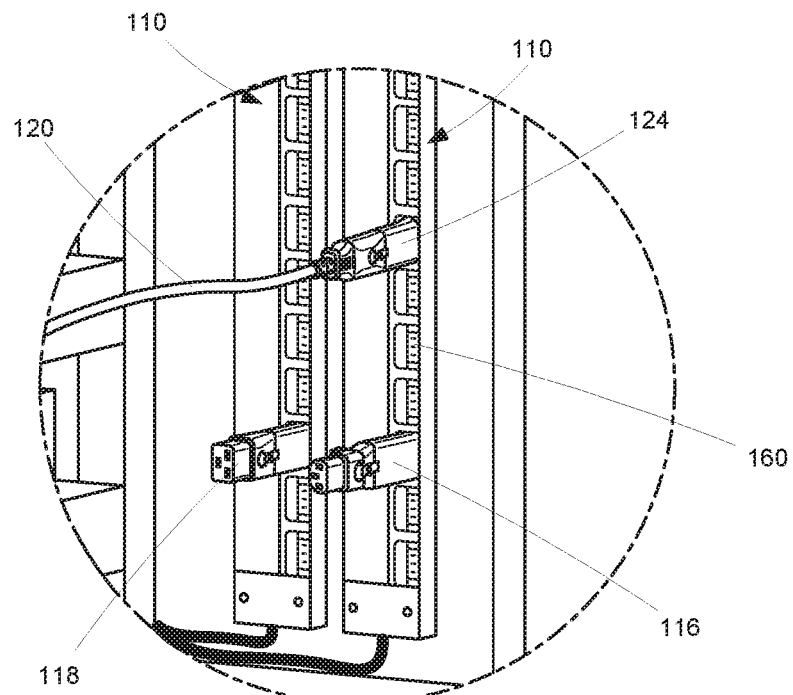
FIG. 3A is an enlarged partial isometric view of a smart cable and connector adapters, each according to a representative embodiment.

As shown in FIG. 3A, power connector adapters 116 and 118 are configured in accordance with embodiments of the present technology to adapt IEC C13/C14 and IEC C19/C20 power cords, respectively, to the outlet connectors 160 of the PDUs 110. In the embodiments of FIG. 3A, the power connector adapters 116 and 118 are illustrated as including IEC-type connectors, although it will be readily understood that any of various other types of connectors can be used. For example and without limitation, the power connector adapters 116 and 118 can include NEMA type connectors (e.g., NEMA 5-15R, NEMA 6-20R, NEMA 6-30R or NEMA 6-50R) or any other of the various IEC type connectors.

Figure 3B:
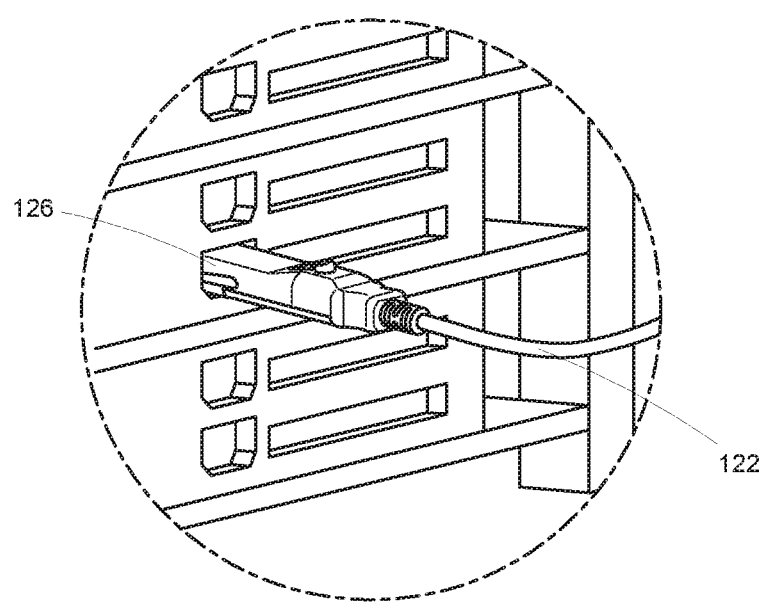
FIG. 3B is an enlarged partial isometric view showing a smart cable connected to an electronic appliance, such as a server.

In some embodiments, a smart cable 120 can be used to connect electronic equipment to the PDUs 110. As explained more fully below, the smart cable 120 can supply power from the PDU 110 to the electrical equipment and can be configured to report power-related information and/or parameters about the electrical equipment, as well as a unique identifier corresponding to the electrical equipment, to the PDU 110. In some embodiments, the smart cable 120 includes a PDU connector 124 configured to mate with the PDU 110 and to house a PDU interface for reporting the power-related information and the unique identifier as well as provide power switching. In other embodiments, such as shown in FIG. 3B, a smart cable 122 includes a connector 126 configured to mate with the electronic equipment (e.g., industry standard connector) and house the PDU interface, rather than the PDU interface being housed in the PDU connector.

Figure 4A:
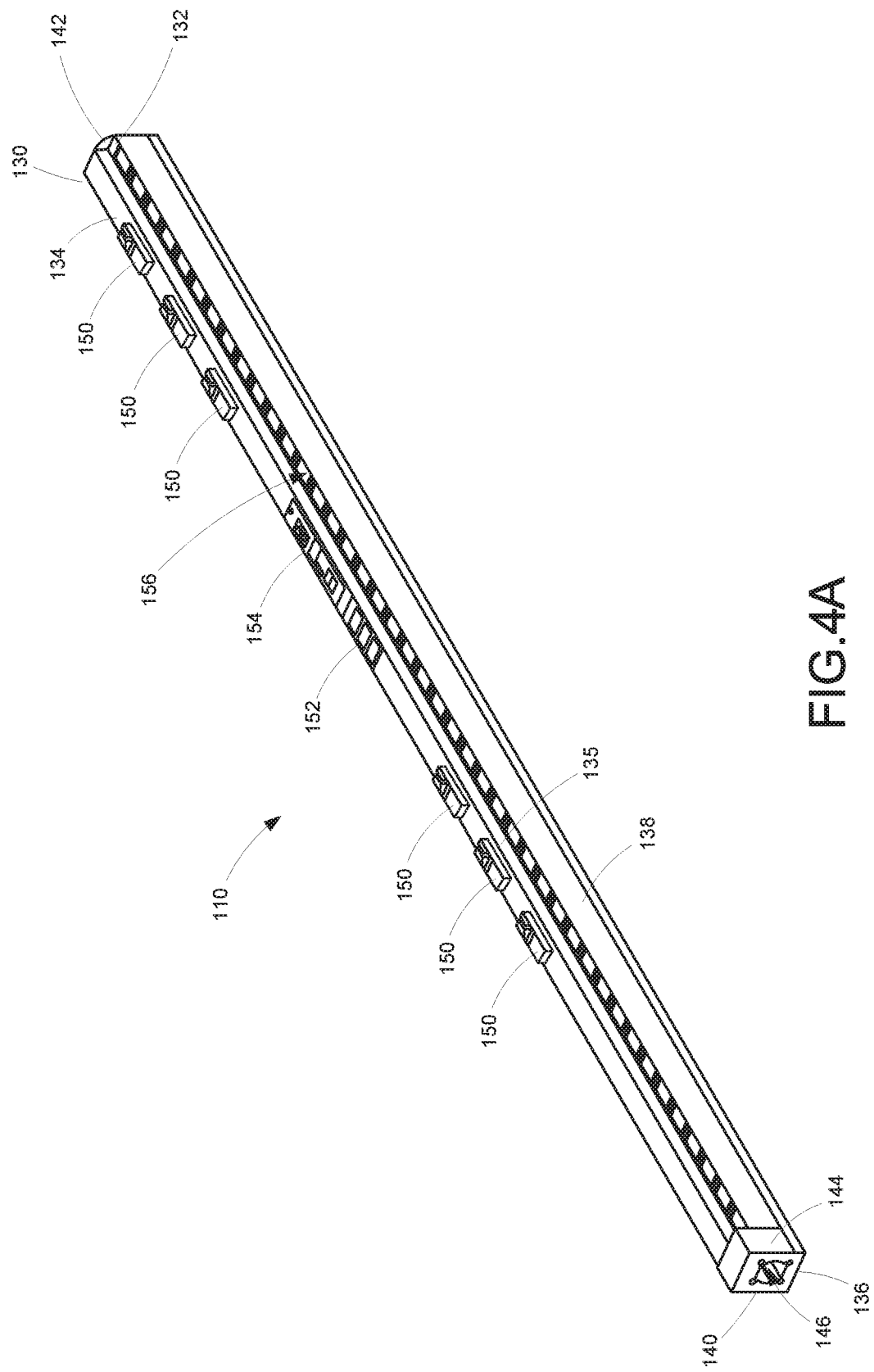
FIG. 4A is an isometric view of a representative one of the PDUs introduced in FIGS. 2A and 2B.

Turning to FIG. 4A, the PDU 110 includes an elongate PDU housing 130 including a front face having an outlet panel 132 extending along a length of the PDU 110 and a non-outlet panel 134 parallel to and offset from the outlet panel 132. Accordingly, the front of the PDU 110 includes an outlet region extending along a length of the PDU and a non-outlet region positioned side-by-side with the outlet region. The housing 130 includes a rear face having a rear panel 136 positioned opposite the outlet panel 132 and the non-outlet panel 134 with a pair of sidewalls 138 and 140 extending therebetween. An intermediate panel 135 extends orthogonally between the outlet panel 132 and the non-outlet panel 134 such that the non-outlet panel 134 is raised relative to the outlet panel 132. The housing 130 also includes an end wall 142 and an endcap 144 positioned opposite the end wall 142.

The endcap 144 includes a cord opening 146 configured to receive a power input cord (not shown) that penetrates the PDU housing 130. The power input cord may be connected to an external power source to provide power to the PDU 110. In some embodiments, the external power source may provide multiple phases of power, from a polyphase power source, to the PDU 110. The power input cord electrically interconnects one or more power line circuits (not shown) of the PDU 110 to the external power source. Each of the power line circuits may be associated with a phase of power provided by the external power source.

In some embodiments, the non-outlet region or non-outlet panel 134 supports various non-outlet components, such as overcurrent protection devices 150, a power metrics display 152, and a communications interface 154, for example. In some embodiments, the components can be aligned along the length of the housing as shown in the depicted embodiment. The outlet region or outlet panel 132 includes a plurality of apertures 156 each preferably corresponding to an associated one of the plurality of outlet connectors 160 (FIG. 3A), although it is understood that each aperture 156 could accommodate more than one outlet connector 160, if desired. In some embodiments, the plurality of outlet connectors 160 (FIG. 3A) comprises 42 outlet connectors extending substantially the entire length of the housing 130. In other various embodiments, the plurality of outlet connectors 160 (FIG. 3A) can comprise 45, 48, 51, or 54 outlet connectors, for example, or any other suitable number.

The power metrics display 152 may be used to provide a local display of information related to the current operating parameters of the PDU 110, such as power-related parameters of the power input cord and/or one or more of the outlet connectors 160. In one embodiment, the power-related parameter is the quantity of current (e.g., amperes) being provided through the power input cord and/or one or more of the outlet connectors 160. The power-related parameter may also include a quantity of voltage (e.g., volts) being provided through the power input cord and/or one or more of the outlet connectors 160, a frequency of power (e.g., Hertz) being provided through the power input cord and/or one or more of the outlet connectors 160, a quantity of power (e.g., Watts) being provided through the power input cord and/or one or more of the outlet connectors 160, a quantity of power over a period of time, i.e., energy (e.g., kilowatt hours) being provided through the power input cord and/or one or more of the outlet connectors 160, and/or other power-related parameters. The power metrics display 152 may display one or more of the power-related parameters using various display technologies, such as segment displays, light-emitting diode displays, and/or liquid crystal displays, to name a few. In some embodiments, other operating parameters of the PDU can be monitored and/or displayed, such as configuration data, IP address, environmental sensor data, residual current, etc.

The communications interface 154 may be coupleable with one or more of a local computer, local computer network, and/or remote computer network. The communications interface 154 may be used to report information related to current operating parameters of the PDU 110 to one or more of the local computer, local computer network, and/or remote computer network. The communications interface 154 may also receive information or instructions related to the operation of the PDU 110 from one or more of the local computer, local computer network, and/or remote computer network. The communications interface 154 may be in communication with a communications bus of the PDU 110.

Figure 4B:
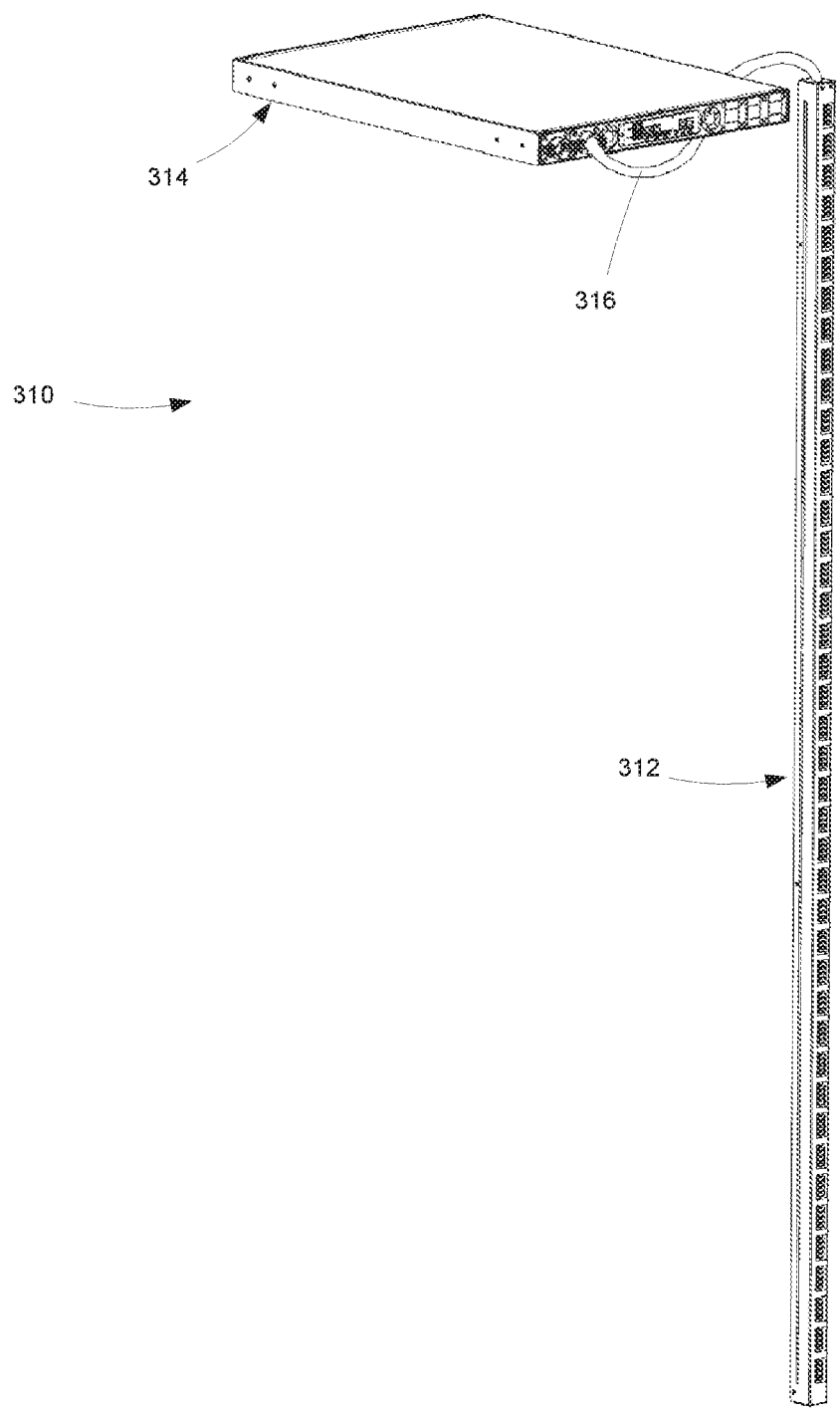
FIG. 4B is an isometric view of a two-piece PDU according to a representative embodiment having horizontal and vertical components.

In some embodiments, the outlet and non-outlet regions are contained in a common PDU housing, such as housing 130 shown in FIG. 4A. However, in other embodiments, an alternative construction positions the outlet region and the non-outlet region in separate chassis. For example, as shown in FIG. 4B, a PDU 310 can include a vertical chassis 312 containing the outlet region and a horizontal chassis 314 containing the non-outlet region interconnected with one or more cables 316. Accordingly, the horizontal chassis 314 can include the power supplies, circuit protection devices, input power measurement circuits, switching circuits, outlet power measurement circuits, environmental sensors, displays, and a network interface module. This allows all of the temperature sensitive components to be cooled via air from a facility's cold-aisle, which flows through the horizontal chassis 314 and exhausts out the rear into the facility's hot-aisle. The vertical chassis 312 houses the outlets which can operate reliably in the relatively high temperatures of the facility's hot aisle. By locating the temperature sensitive components in the cooler horizontal chassis 314, the reliability of those components is greatly enhanced. Therefore, the overall reliability of the PDU 310 can be enhanced. Furthermore, if a component located in the horizontal chassis 314 fails necessitating a replacement of the chassis, the horizontal chassis 314 is much easier to replace than a PDU containing the outlet and non-outlet regions in one chassis. Returning briefly to FIG. 1D for example, if the inner PDU 15(1) fails, essentially all of the cables 17 may need to be disconnected from both the inner 15(1) and outer 15(2) PDUs in order to remove the inner PDU 15(1) from the equipment cabinet 13. Disconnecting these power cables may render electronic equipment within the equipment rack inoperative which is undesirable in a data center environment. Earlier PDU designs exist where the size of the vertical portion of the PDU was reduced by moving displays and a network interface card to a horizontal enclosure. However, these earlier designs were focused on space constraints and did not move heat sensitive components out of the vertical enclosure.

Figure 5:
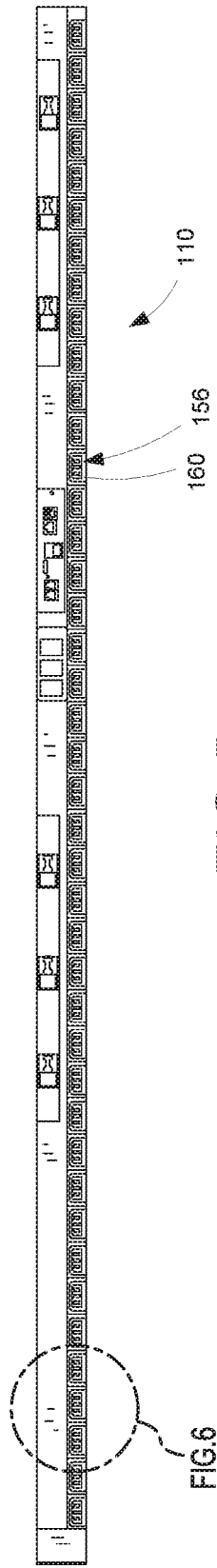
FIG. 5 is a top plan view of the PDU shown in FIG. 4A.
Figure 6:
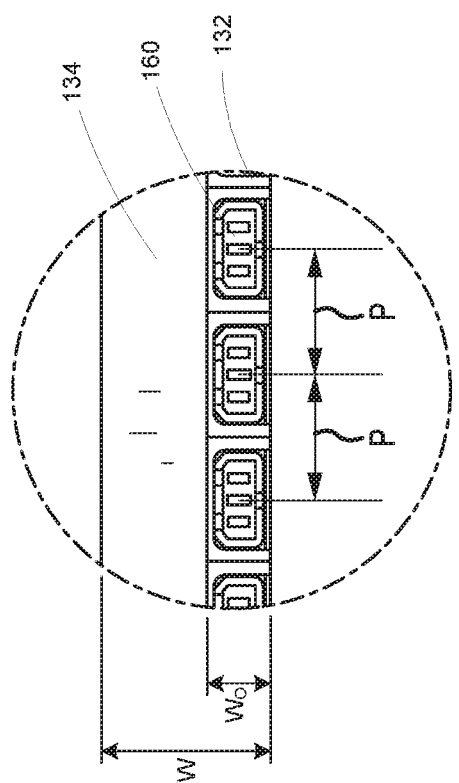
FIG. 6 is an enlarged view of a portion of the PDU as shown in FIG. 5.

As shown in FIG. 5, the plurality of outlet connectors 160 are spaced equidistantly along the length of the PDU 110 and each have a common construction. As described more fully below with respect to FIGS. 10 and 11, each outlet connector 160 can include at least three aligned electrical terminals. It should be appreciated here, however, that the electrical terminals of each outlet connector 160 are aligned along the length of the PDU 110. With further reference to FIG. 6, in some embodiments, the outlet connectors 160 are spaced along a pitch P of 1 U or approximately 1.7 inches.

Figure 7:
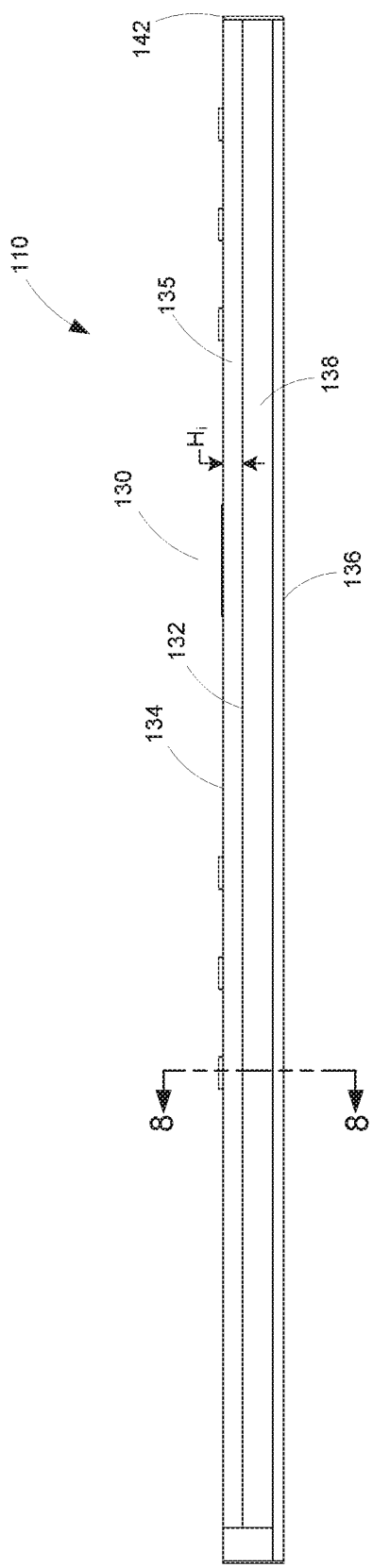
FIG. 7 is a side view in elevation of the PDU shown in FIGS. 4A, 5, and 6.

In some embodiments, the PDU 110 has a width W of between about 1.7 inches and about 3.0 inches. In at least one embodiment the PDU 110 has a width W of approximately 2.18 inches or less. In some embodiments, the outlet panel 132 has a width $W_O$ of approximately 0.83 inches or less. In some embodiments, the outlet panel 132 has a width $W_O$ that is less than a width of an IEC C14 connector. With reference to FIG. 7, the outlet panel 132 and the non-outlet panel 134 are offset a distance corresponding to the height $H_i$ of the intermediate panel 135. In some embodiments, the intermediate panel 135 has a height $H_i$ of between about 0.4 and about 0.8 inches. In some embodiments, the intermediate panel 135 has a height $H_i$ of approximately 0.5 inches.

Prior art PDUs having 1 U outlet spacing, such as that shown in FIG. 1D, are typically approximately 3.25 inches wide, which requires a deeper rack to accommodate two PDUs side by side. As described above, the disclosed PDU 110 has a width of approximately 2.18 inches which allows two PDUs to be placed side by side in a relatively shallow rack. In addition, the narrow width of PDU 110 allows the industry standard keyhole spacing (i.e., 2.2 inches) to be used to mount the PDUs in the cabinet.

Figure 8:
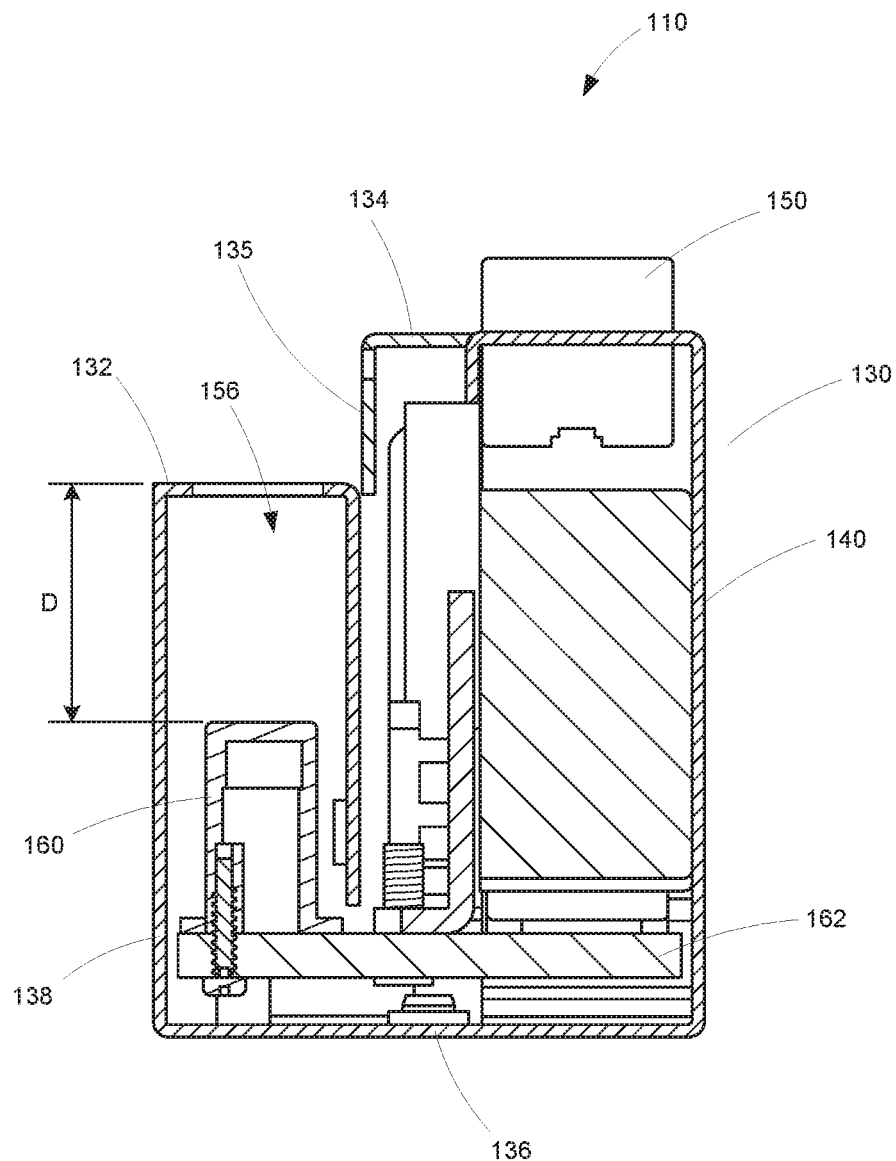
FIG. 8 is a partial cross-sectional view of the PDU taken about line 8-8 in FIG. 7 for illustrating some of the structural components therein.

FIG. 8 is an end view in cross-section of the PDU 110 with the end cap 144 (FIG. 4.) removed to better illustrate the PDU's construction. In some embodiments, one or more substrates, such as printed circuit board (PCB) 162, can be mounted within the housing 130 and electrically connected to the power input. The outlet connectors 160 are arranged along and underneath the outlet panel 132 and mounted to the one or more PCBs 162 with an unobstructed space between adjacent pairs of the plurality of outlet connectors 160. The outlet connectors 160 each extend a portion of the distance between the one or more PCBs 162 and the outlet panel 132. Accordingly, the tops of the outlet connectors 160 are spaced below the outlet panel 132 a distance D. In some embodiments, the tops of the outlet connectors 160 are spaced below the outlet panel 132 a distance D of approximately 1.0 inch. The PCB 162 may include other electrical circuit components of the PDU 110, such as the overcurrent protection devices 150 (FIG. 4). In some embodiments, the PCB 162 is a multi-layer PCB. Different layers of the multi-layer PCB may be associated with different phase power lines of the power input cord (not shown), as further described in U.S. Pat. No. 8,587,950, the disclosure of which is hereby incorporated by reference in its entirety. Suitable polyphase power input configurations, including wye and delta configurations, are also described in U.S. Pat. No. 9,190,842, the disclosure of which is hereby incorporated by reference in its entirety.

Figure 9:
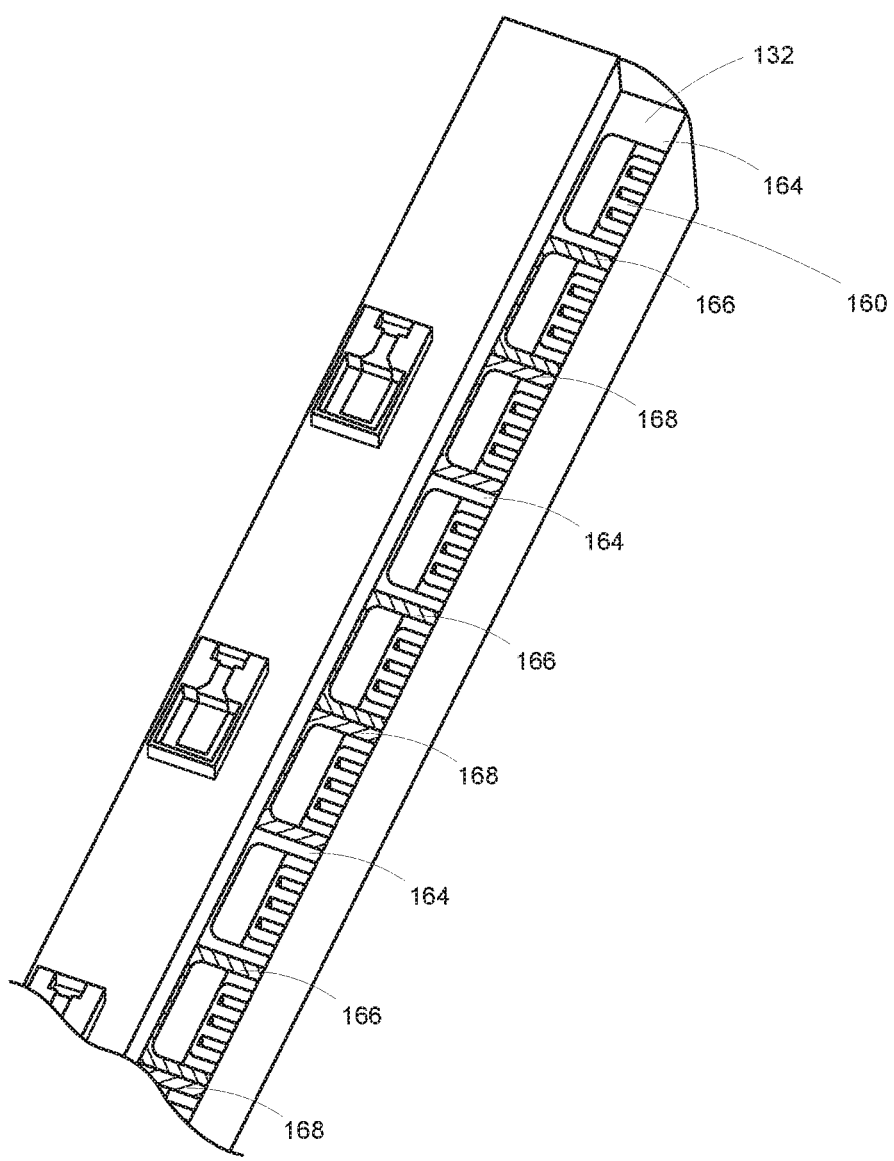
FIG. 9 is a partial isometric view of the PDU illustrating indicia according to a representative embodiment.

In some embodiments, the outlet panel 132 can include indicia (e.g., coloring and/or markings) indicating the phase of the adjacent outlet connector 160. For example, as shown in FIG. 9, the outlet panel 132 can include different color coded regions 164, 166, and 168 (indicated with cross-hatching) corresponding to different phases. The color coded regions 164, 166, and 168 can facilitate balancing the load from the electrical equipment between the different phases. Furthermore, having the different phases available along the length of the PDU allows the power cables to extend straight across between the equipment and the PDU as explained above with respect to FIGS. 2A and 2B.

Figure 10:
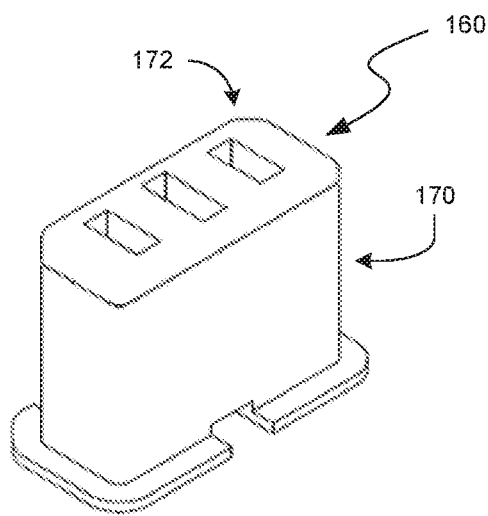
FIG. 10 is an isometric view illustrating an outlet connector according to a representative embodiment.
Figure 11:
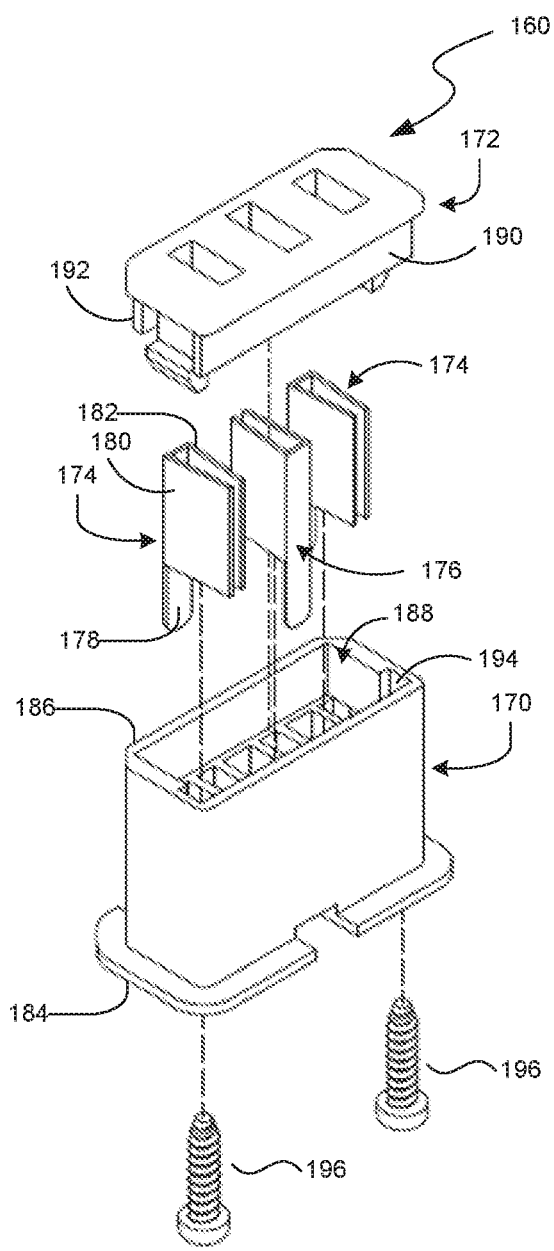
FIG. 11 is an exploded isometric view illustrating the outlet connector shown in FIG. 10.

As shown in FIG. 10, the outlet connector 160 is a non-industry standard connector, e.g., it is not an IEC or NEMA standard connector. In some embodiments, the outlet connector 160 includes an outlet core 170 and an end cap 172 connected to the outlet core. In some embodiments, the end cap 172 (e.g., the face of the connector) can be colored or marked to reflect its connection to polyphaser input. With further reference to FIG. 11, outlet connector 160 includes a plurality of electrical terminals 174 and 176. Electrical terminals 174 and 176 are positioned between the outlet core 170 and the end cap 172. Connector 160 includes two outer electrical terminals 174 and a middle electrical terminal 176. In some embodiments, electrical terminals 174 and 176 have the same construction although middle terminal 176 is positioned to face the opposite direction of electrical terminals 174. Thus, although the electrical terminals are aligned with respect to each other, the middle connection tab is offset from the outer electrical terminal's connection tabs. In other embodiments, the terminals may be different sizes. For example, in this embodiment middle terminal 176 is larger than the outer terminals 174.

In some embodiments, electrical terminals 174 and 176 are constructed from suitable electrically conductive materials such as tin, gold, silver, copper, phosphor bronze, and the like. Multiple materials can be used in combination. In one embodiment, the terminals comprise copper alloy with a tin plating. In some embodiments, the terminals such as outer terminals 174 are formed from a single piece of conductive material by bending contacts 180 and 182 away from connection tab 178. Although the electrical terminals are aligned with respect to each other, the middle connection tab is offset from the outer electrical terminals' connection tabs. Contacts 180 and 182 are bent inward towards each other such that when a mating contact (not shown) is inserted into the electrical terminal, the contacts 180 and 182 are urged toward the mating terminal. Accordingly, in some embodiments it is desirable to form the electrical terminals 174 and 176 from a conductive resilient spring-like material. Connection tabs 178 extend through and beyond the input side 184 of the connector core 170. Likewise, contacts 180 and 182 are positioned toward the output side 186 of the outlet core 170. It can be appreciated from the figure that electrical terminals 174 and 176 are configured as female receptacles. In other embodiments the electrical terminals 174 and 176 may be configured as male terminals or a combination of male and female terminals.

As shown in FIG. 11, end cap 172 is insertable into cavity 188 formed in outlet core 170. Internal indexing features 190 and 192 help ensure that end cap 172 is inserted into cavity 188 in the correct orientation. Features 190 and 192 act in cooperation with indexing relief feature 194 formed into the side of cavity 188. In some embodiments, the outlet connector 160 is mountable to a printed circuit board or other surface with mounting screws 196. The outlet connector 160 is further described in co-pending U.S. patent application Ser. No. 14/687,670, filed Apr. 15, 2015, the disclosure of which is hereby incorporated by reference in its entirety.

Figure 12:
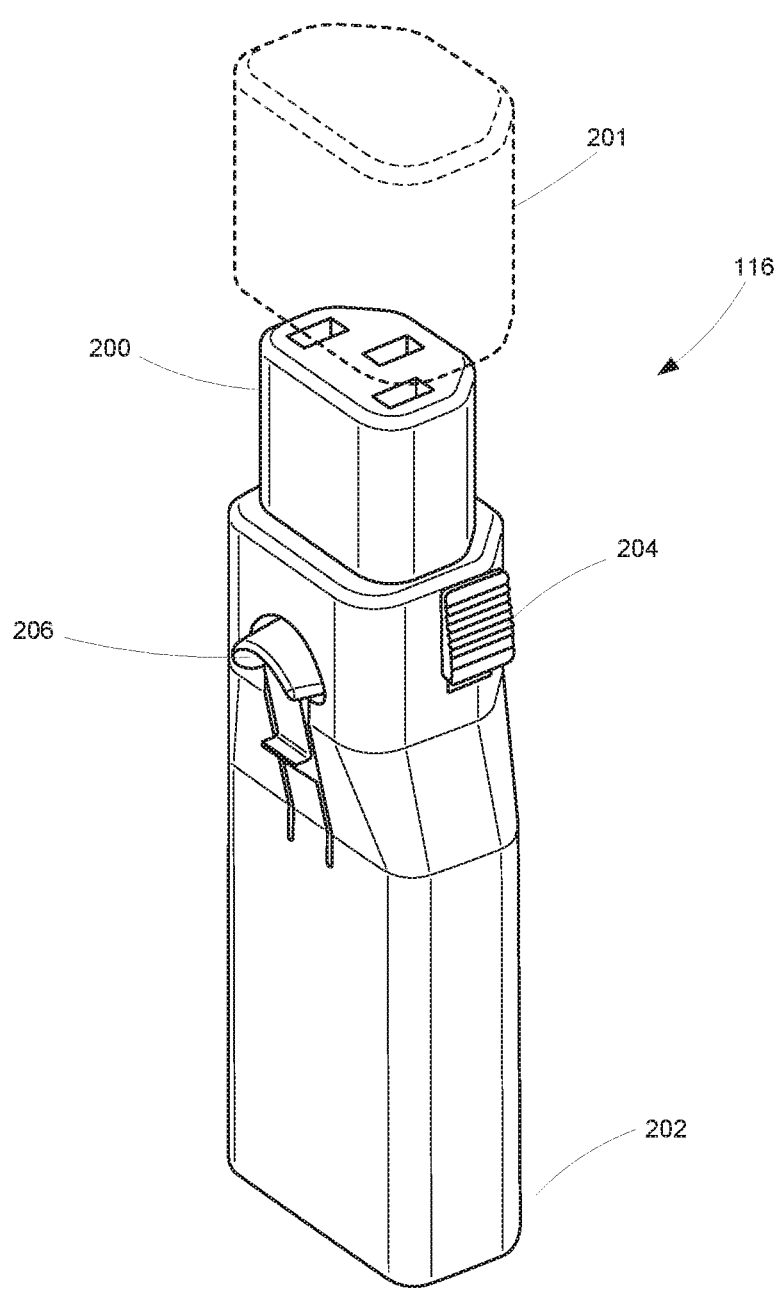
FIG. 12 is an isometric view illustrating a connector adapter according to a representative embodiment.

As mentioned above, the power connector adapter 116, as shown in FIG. 12, is configured to adapt an IEC C13/C14 power cord to an outlet connector 160 (FIG. 9). In a representative embodiment, the power connector adapter 116 can include a first connector 200 configured to mate with an industry standard connector. For example, in the depicted embodiment, the first connector 200 is configured as an IEC C13 in order to mate with a C14 connector of a standard power cord (not shown). The power connector adapter 116 also includes a second connector 202 (also referred to herein as a PDU connector) configured to mate with outlet connector 160. A first attachment mechanism 204 is associated with the first connector 200 and a second attachment mechanism 206 is associated with the second connector 202.

Figure 13:
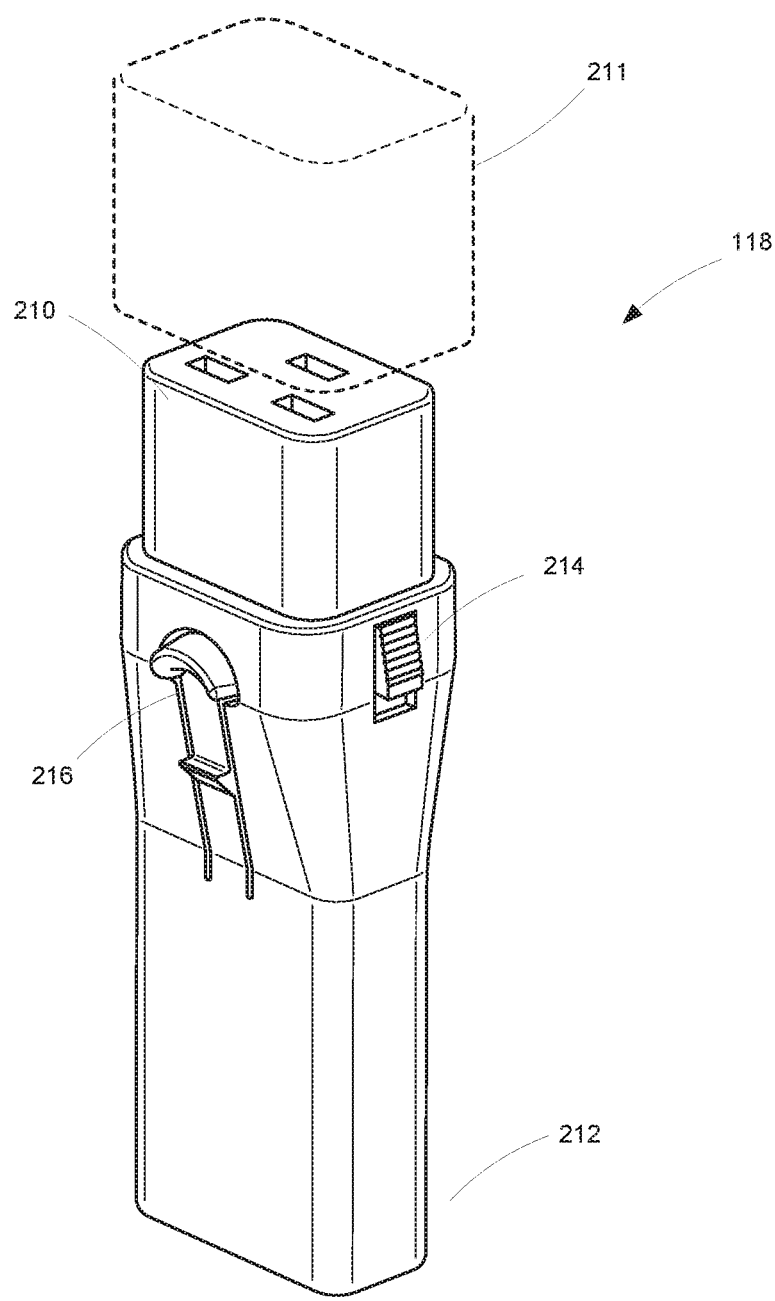
FIG. 13 is an isometric view illustrating a connector adapter according to another representative embodiment.

FIG. 13 illustrates another power connector adapter 118 similar to power connector adapter 116 except that power connector adapter 118 is configured to adapt an IEC C19/C20 power cord to an outlet connector 160. The power connector adapter 118 can include a first connector 210 configured as an IEC C19 in order to mate with a C20 connector of a standard power cord (not shown). The power connector adapter 118 also includes a second connector 212 configured to mate with outlet connector 160. A first attachment mechanism 214 is associated with the first connector 210 and a second attachment mechanism 216 is associated with the second connector 212.

Figure 14:
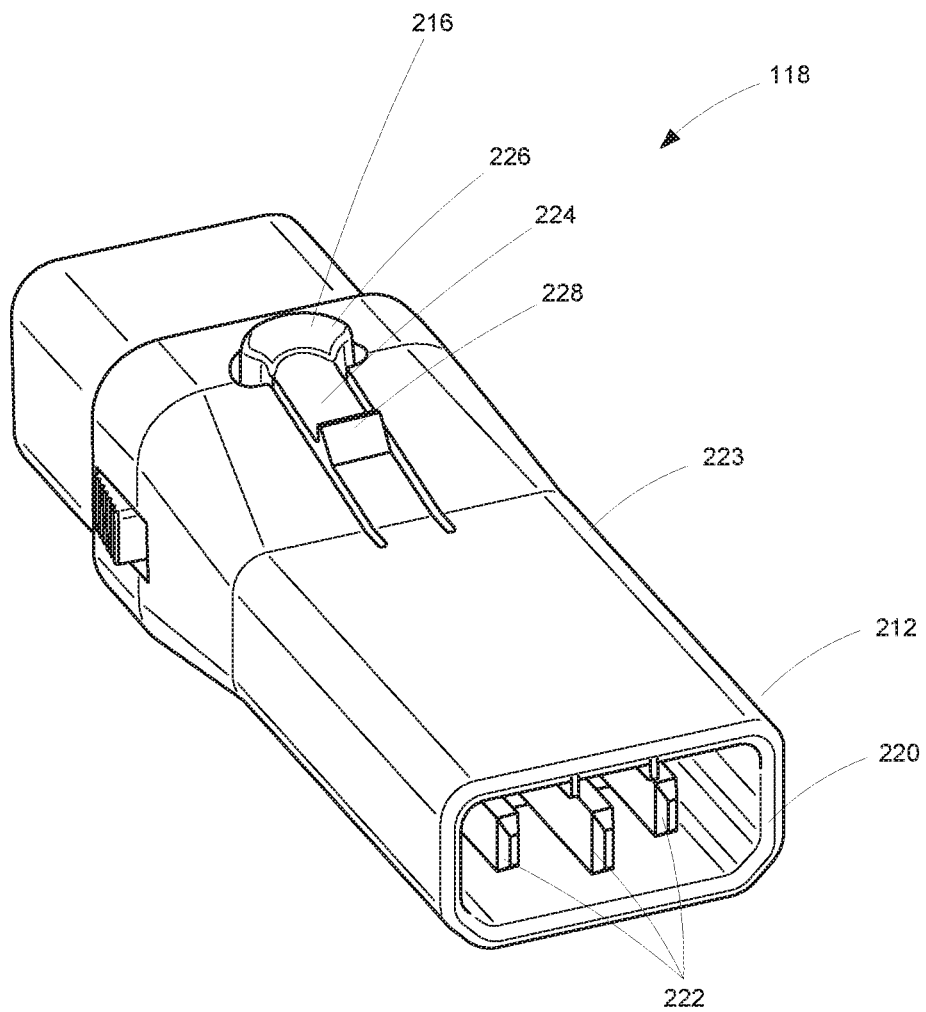
FIG. 14 is an isometric view illustrating the connector adapter shown in FIG. 13 as viewed from the opposite end.

With reference to FIG. 14, the second connector 212 includes a shroud portion 220 configured to mate with the outlet core 170 (FIG. 10) of the outlet connector 160. Male terminals 222 are positioned in the shroud 220 to mate with corresponding terminals 174 and 176 of the outlet connector 160 (FIG. 11). In some embodiments, the second attachment mechanism 216 can include a spring arm 224 integrally formed with a housing 223 of the power connector adapter 118. A latch barb 228 is disposed on the spring arm 224 at an approximate midpoint thereof. The spring arm 224 extends from a first end portion connected to the housing 223 to terminate at a second end portion having an actuation button 226. When the second connector 212 is inserted into an aperture 156 (FIG. 8) to mate with an outlet connector 160, the latch barb 228 engages, in a secured state, a portion (e.g., a lip) of the outlet panel 132 thereby retainably coupling the power connector adapter 118 to the PDU 110. When a user pushes the actuation button 226, the latch barb 228 is moved from the secured state to an unsecured state thereby allowing removal of the power connector adapter 118 from the PDU 110. It should be readily understood that the second connector 202 and the second attachment mechanism 206 of power adapter 116 (FIG. 12) can each be constructed in a substantially similar manner to that described here with respect to FIG. 14.

It can be appreciated in at least FIGS. 12-14 that the second connectors 202 and 212 are noticeably smaller than the industry standard C14 and C20 connectors, 201 and 211 respectively, that mate with the first connectors 200 and 210. Furthermore, the mating PDU connectors or outlet connectors 160 are smaller still. The relatively small size of the outlet connectors 160 allows them to be spaced at 1 U. In addition, the relatively small size of the outlet connectors 160, in conjunction with the orientation of the overcurrent protection devices 150, allow the PDU 110 to have a narrower width than is possible with industry standard connectors.

Figure 15:
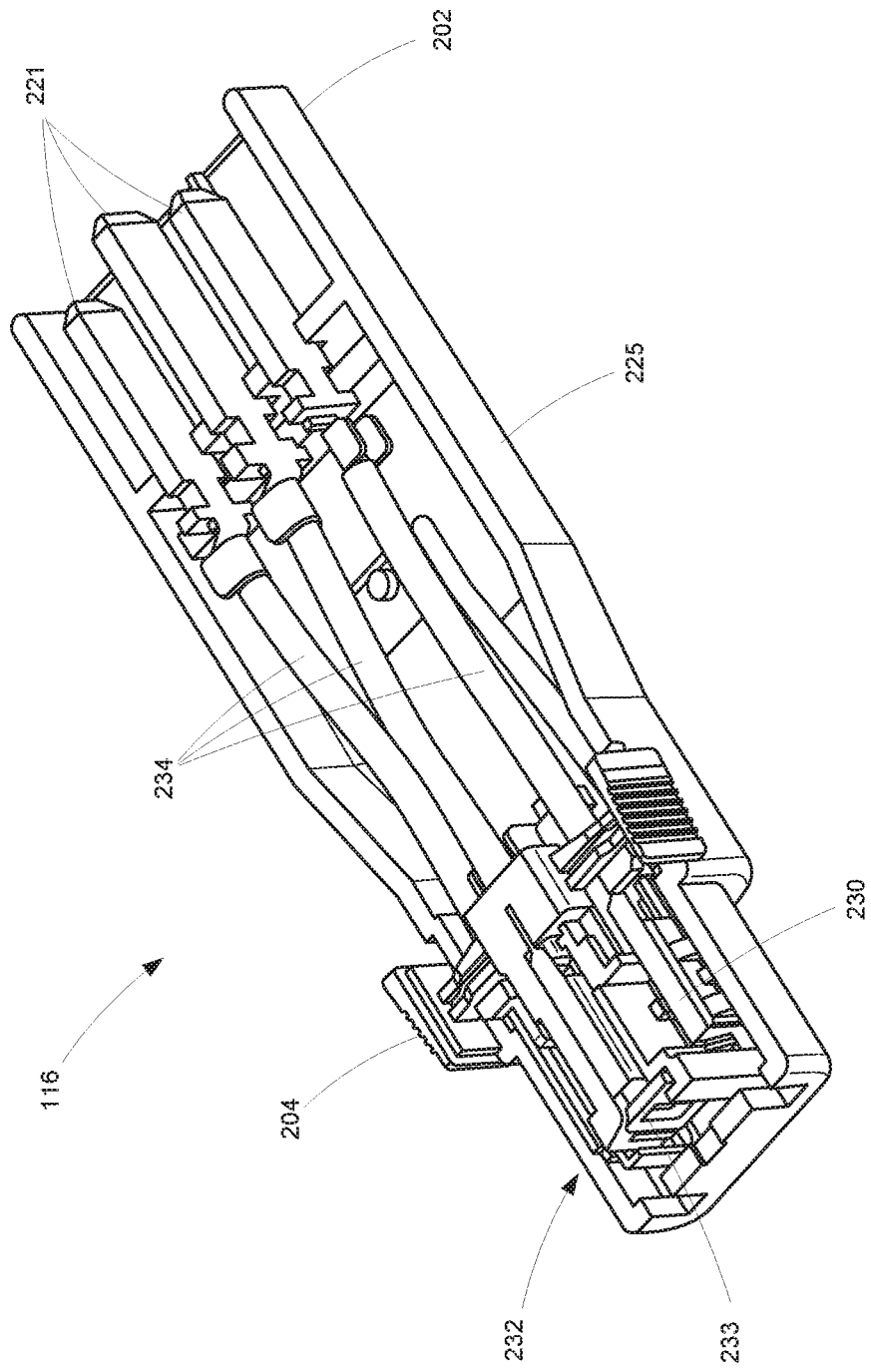
FIG. 15 is an isometric view illustrating the internal components of the connector adapter of FIG. 12.

FIG. 15 is an isometric view of the power connector adapter 116 with one half of the housing 225 removed to illustrate the internal components of the connector adapter. Male terminals 221 are connected to corresponding female terminals 230 via conductors 234. In some embodiments, the conductors 234 are crimped and/or soldered to the male and female terminals 221 and 230, respectively. The first attachment mechanism 204 includes a latch assembly 232 with a releasable latch plate 233 configured to engage a male pin of a mating C14 connector, for example.

As shown in FIG. 16, the housing 225 can include a latch cover 236 mounted on an interior surface of the housing 225 behind the second attachment mechanism 206 (FIG. 12). The latch cover 236 covers the gap around the second attachment mechanism 206 ensuring that the internal components (e.g., conductors 234 and terminals 221 and 230) are securely enclosed to prevent a user from contacting them. The latch cover 236 includes a pocket 240 that allows the attachment mechanism to be depressed by a user. In some embodiments, the latch cover 236 is positioned on pins 238 extending from the housing 225. Once the latch cover 236 is in position, the pins 238 can be melted to heat stake the cover 236 in place.

Figure 17A:
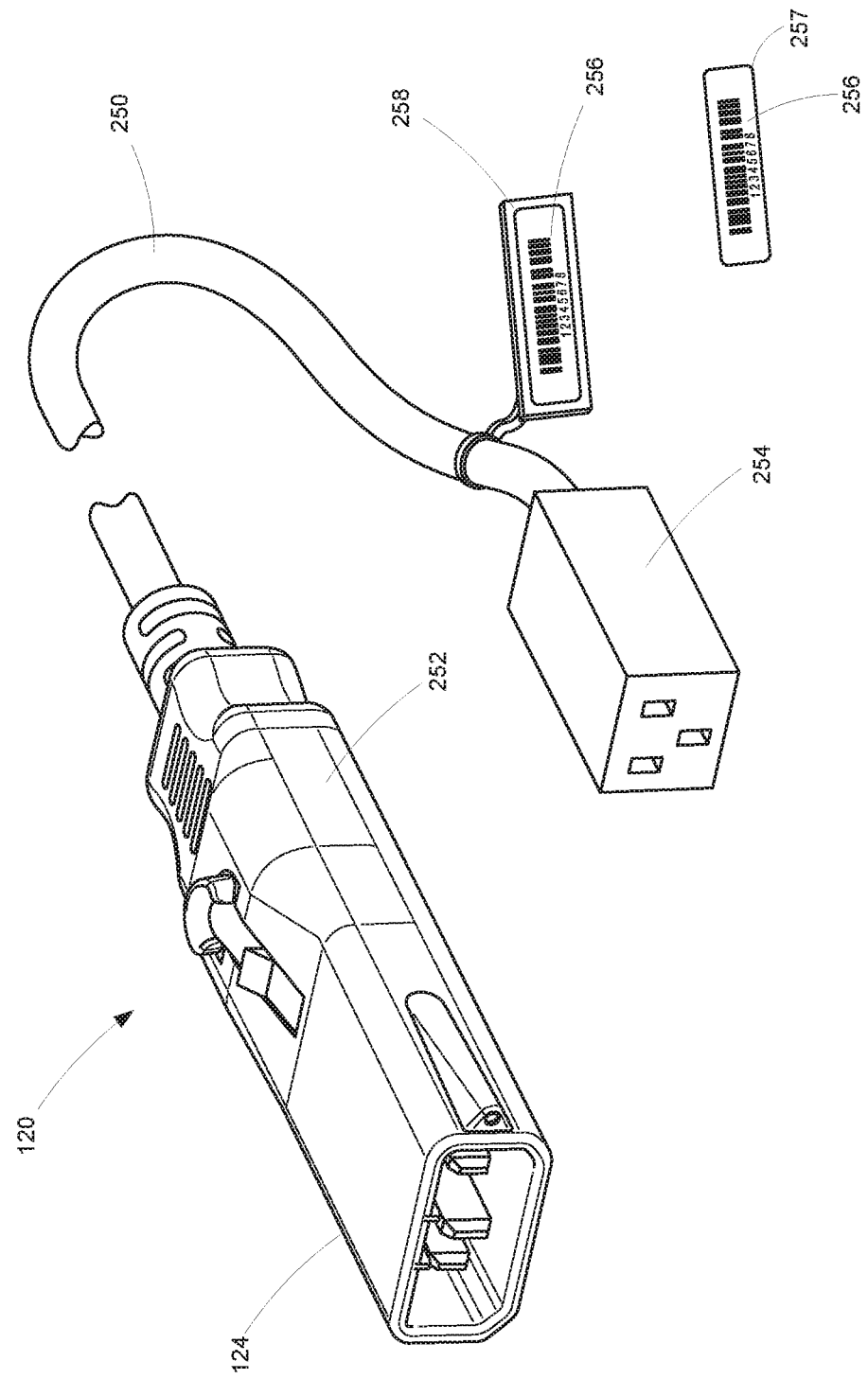
FIG. 17A is an isometric view illustrating a smart cable according to a representative embodiment.

FIG. 17A is an isometric view of the smart cable 120 introduced above. The smart cable 120 is configured to connect electrical equipment to the disclosed PDUs 110. In some embodiments, the smart cable 120 is configured to report power-related information about the electrical equipment, switch power on and off to the electrical equipment and/or report a unique identifier corresponding to the equipment to the PDU.

In a representative embodiment, the smart cable 120 includes a connector 124 configured to removably connect the smart cable 120 to a mateable interface of the PDU 110 (e.g., outlet connector 160). Accordingly, various features of the connector 124 can be constructed similarly, where suitable, to corresponding features of power connector adapters 116 and 118 described above. A power output cable 250 extends into the connector housing 252 at one end and couples to an output connector 254 at the opposite end. The output connector 254 is schematically illustrated to generically represent various connectors, such as IEC and NEMA connector configurations. In at least one embodiment, the output connector 254 can be configured as an IEC C13 connector. In some embodiments, the smart cable 120 includes a unique identifier encoded (e.g., pre-programmed) in an internal memory device that can be used to track the cable and/or electronic equipment connected to the smart cable 120. In some embodiments, the smart cable includes indicia 256 corresponding to the unique identifier. In the depicted embodiment, the indicia is disposed on a tag 258 that can be attached to the power output cable 250, for example. In some embodiments, an additional tag 257 (e.g., sticker) including duplicate indicia 256 can be attached to the electronic equipment being tracked or to the smart cable 120 in a position that can be easily viewed for tracking. In some embodiments, tag 258 can be attached to the electronic equipment, thereby helping ensure that the cable remains with the equipment for tracking purposes. In some embodiments, the smart cable can include LEDs indicating On/Off status. In some embodiments, LEDs can indicate a power parameter level based upon programmable or preset thresholds each corresponding to a different color on a multicolor LED or by flashing.

Figure 17B:
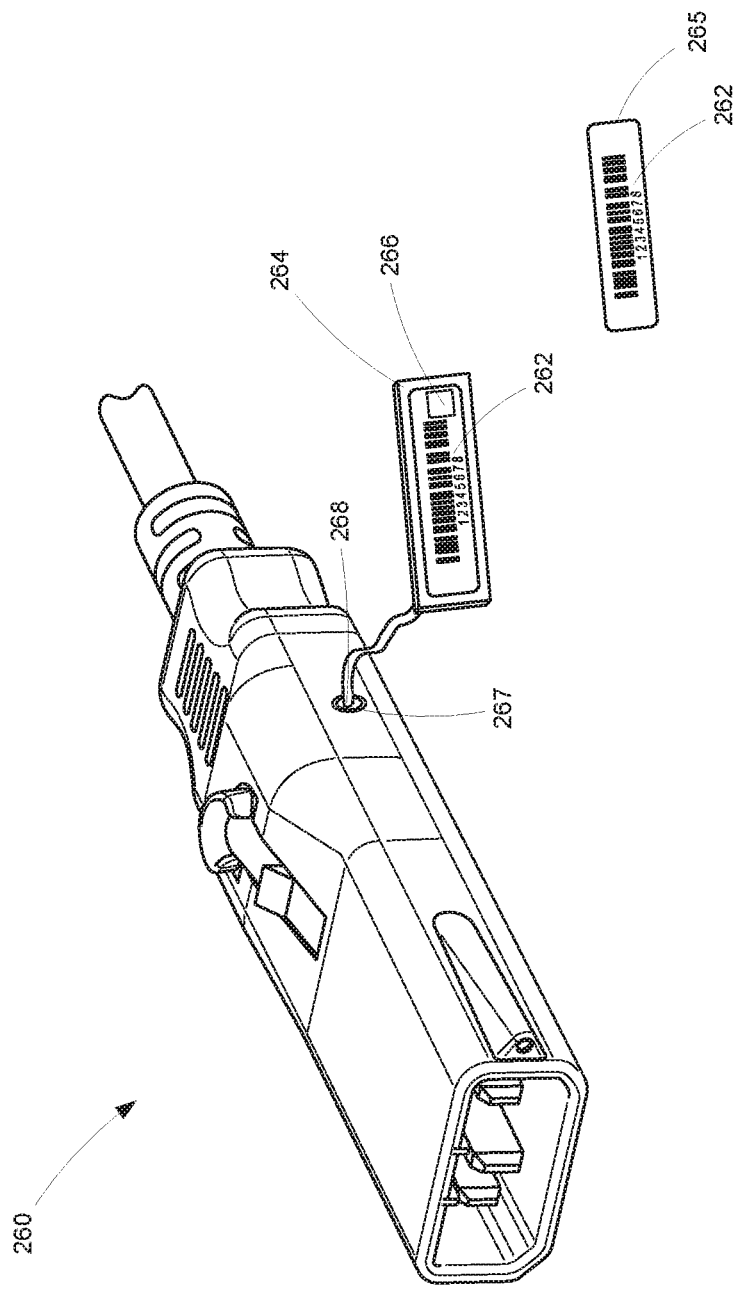
FIG. 17B is an isometric view illustrating a portion of a smart cable according to another representative embodiment.

In another representative embodiment shown in FIG. 17B, a smart cable 260 can include a connector 267 (e.g., receptacle) configured to receive a mating connector 268 of an identifier tag 264. Rather than having a pre-programmed identifier, the smart cable 260 reads a unique identifier from the tag 264 when it is connected. In some embodiments, the unique identifier can be stored on a memory device 266, such as a microchip, RFID tag, or other readable device and/or media. In some embodiments, the identifier tag 264 includes indicia 262 corresponding to the unique identifier stored in memory device 266. In some embodiments, an additional tag 265 (e.g., sticker) including duplicate indicia 262 can be attached to the electronic equipment being tracked or to the smart cable 260 in a position that can be easily viewed for tracking. In some embodiments, tag 264 can be attached to the electronic equipment, thereby helping ensure that the tag remains with the equipment for tracking purposes.

Once an identifier tag (e.g., tag 258 or tag 264) is physically attached to the electronic equipment, information about that equipment can be associated with the tag's unique identifier in a database. For example, a description and a location of the equipment can be entered into the database corresponding to the tag's unique identifier. Accordingly, when information, such as power-related information or parameters, is reported from a smart cable via the network interface card, that information is reported along with the tag's unique identifier so that the information can be associated with the equipment. If the electronic equipment is subsequently moved, the database can be updated with the equipment's new location with the same unique identifier. If the equipment is replaced, a new tag can be placed on the equipment and the tag's unique identifier can be entered into the database with the new equipment's description and location.

Figure 18:
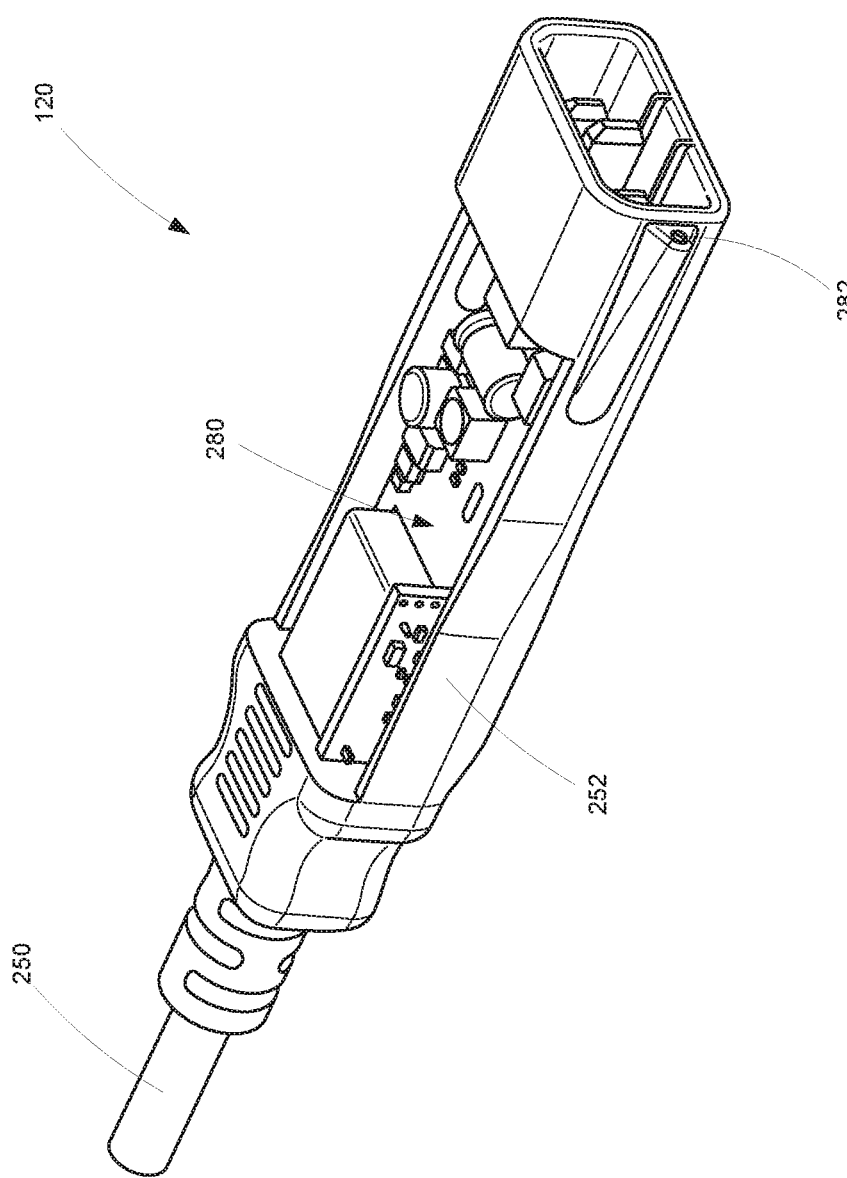
FIG. 18 is an isometric view illustrating the internal components of the smart cable connector of FIG. 17A.

As shown in FIG. 18, the smart cable 120 contains a PDU interface 280 disposed in the connector housing 252. In some embodiments, the PDU interface comprises a PCB with various circuitry. For example, the PDU interface 280 can include a sensing device configured to sense at least one power-related parameter of the power output cable 250 and an optical signal interface 282. In addition, the PDU interface 280 can include a memory device for storing a preprogramed unique identifier and/or circuitry to read a unique identifier from an identifier tag 264 (FIG. 17B). The optical signal interface 282 is configured to report the power-related parameter and the unique identifier to the PDU 110 which can include a suitable interface to communicate with the PDU interface 280. The optical interface provides at least two main advantages. It provides a non-contact interface between the PDU and the smart cable eliminating the need for a connector on the smart cable and a mating connector on the PDU. It also provides electrical isolation so that the power supply in the smart cable can be derived (and referenced) directly from the AC source which allows for a smaller circuit as isolation between the low voltage DC and high voltage AC is not required. The optical interface isolates the user of the PDU from the high voltage AC, used to power the circuitry contained within the smart cable, in accordance with applicable safety agency standards.

In some embodiments, the smart cable 120 can receive control signals from the PDU, via the optical signal interface, to control the operation of the smart cable. For example, the control signals may control the operation of a relay within the smart cable 120. The control signals may switch the relay between a first state which allows current to flow through the power output cord 250 of the smart cable 120, and a second state which prevents current from flowing through the power output cord 250. In some embodiments, a smart cable can include all of the necessary circuitry to provide all of the features described herein (i.e. switching, metering, asset tracking, etc.) with the ability to turn various features on and off via purchasable keys (e.g., software key) so a customer can upgrade to additional functionality in the future without having to change cables. This also allows the manufacturer to build and stock a single smart cord that can support all of the needed functionality but can be configured to provide only the requested functionality at the time an order is placed thus reducing inventory costs.

Figure 19:
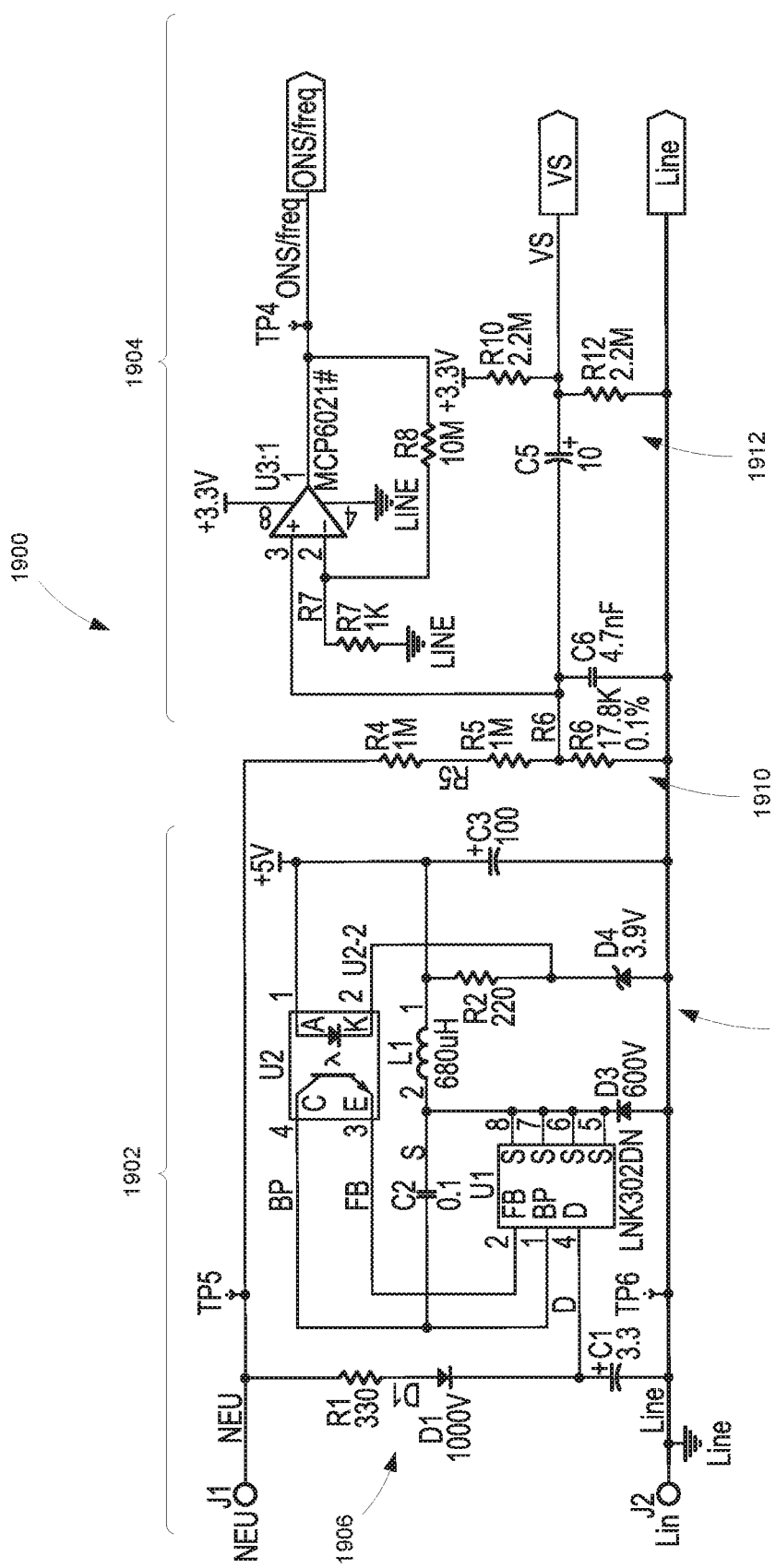
FIG. 19 is a circuit diagram illustrating an example of a power supply circuit, in accordance with various aspects of the present disclosure.

FIGS. 19-22 illustrate various circuits contained in the PDU interface 280 of the smart cable 120. FIG. 19 is a schematic diagram illustrating a power supply circuit 1900 according to a representative embodiment. The power supply circuit 1900 derives low voltage from the AC input line that is used to power the smart cable. The power supply circuit 1900 includes an offline power supply circuit 1902 and an on-sense/frequency detection circuit 1904. The offline power supply circuit 1902 is operative to convert line voltage (e.g., 75-260 VAC) to 5 VDC for powering the various microprocessors and electronics of the PDU interface 280.

In the depicted embodiment, the offline power supply circuit 1902 includes a half-wave rectifier 1906, comprising R1 and D1, which charges a capacitor C1 to the peak of the line voltage (e.g., 75-260 VAC). U1 connects capacitor C1 to inductor L1 very briefly, thereby charging inductor L1 to approximately 0.3 Amps. When the magnetic field of the inductor L1 collapses, the energy in the inductor flows into an output filter capacitor C3, and a feedback circuit 1908, comprising R2 and D4, provides a 3.9 V signal to the optical isolator U2. The optical isolator U2 provides a feedback signal (FB) to the IC U1 signaling it to stop charging L1. This charging cycle happens approximately 67,000 times/second.

The on-sense/frequency detection circuit 1904 provides a signal (ONS/freq) indicating when the power line voltage is zero to allow relay switching at low line voltage to preserve the relay contacts. The on-sense/frequency detection circuit 1904 includes a voltage divider 1910 to reduce the line voltage to less than 3 Volts. A low pass filter C6 stops high frequency noise from disrupting other components in the circuitry, such as an analog to digital (A/D) convertor. A voltage biasing circuit 1912, comprising C5, R10, and R12, provides 1.65 volts to an A/D convertor on the microprocessor 2152 (FIG. 21B). Voltage on signal VS varies around this bias voltage according to the line voltage input. An operational amplifier U3:1 provides a square wave output ranging from 0 to 3.3 volts according to whether the line voltage is negative or positive, respectively. Thus, the square wave output from U3:1 provides accurate zero crossing information about the wave form of the line voltage input. Thus, the square wave can be used to time when to energize the coils in the relays that provide power to the outlets such that the contacts close when the line voltage is at the zero crossing point of the waveform.

Figure 20:
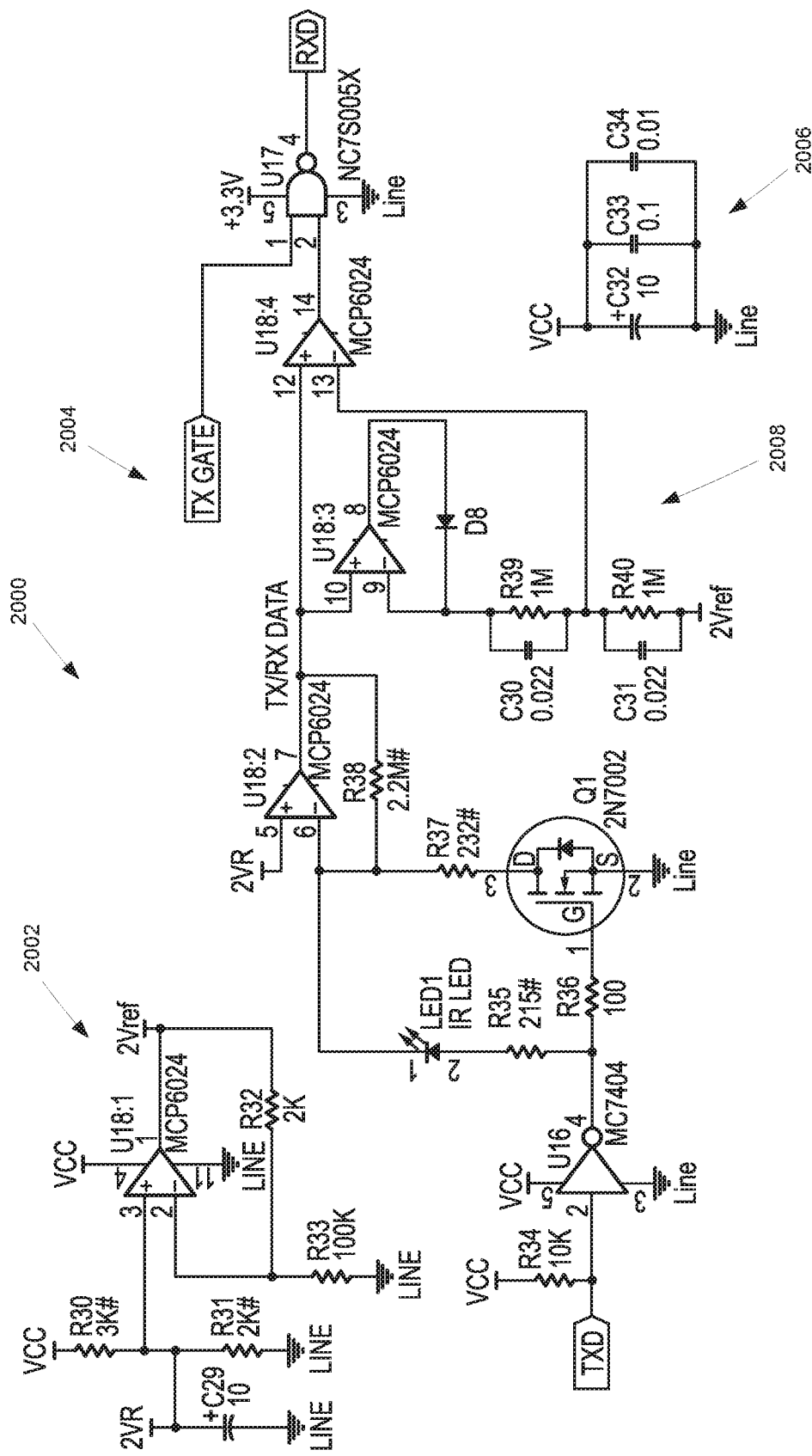
FIG. 20 is a circuit diagram illustrating an example of an optical communication circuit, in accordance with various aspects of the present disclosure.

FIG. 20 is a schematic diagram illustrating an infrared (IR) communication circuit 2000 according to a representative embodiment. The IR communication circuit 2000 includes a two volt reference (2 VR) circuit 2002, a transceiver circuit 2004, and a noise control circuit 2006. The transceiver circuit 2004 includes an IR light emitting diode (LED) identified in the circuit as LED1. The transceiver circuit 2004 is operative to both transmit and receive data optically to and from the PDU using LED1. The optical signal interface 282 (FIG. 18) can include a light pipe to transfer light between the LED1 and an optical interface 2300 of the PDU, as described below with respect to FIG. 23. An inverter U16 inverts a TXD signal from the microprocessor 2152 (FIG. 21B) which in turn activates the transistor Q1 to turn the LED1 on and off in order to transmit a signal when in a transmit mode. In some embodiments, the IR communication circuit 2000 can include a transmit gate U17 that allows the microprocessor to shut off output from comparator U18:4 when the circuit is in the transmit mode in order to prevent erroneous signal data from appearing on the RXD input. When the IR communication circuit 2000 is in a receive mode, light coming into the LED1 produces a small current which produces a high signal from operational amplifier U18:2. A peak detector circuit 2008, including operational amplifier U18:3, provides a reference signal, which is half way between the maximum and minimum value of the receive signal, to comparator U18:4 which provides the received waveform (RXD) to the microprocessor with no bias distortion. The 2 VR circuit 2002 sets the voltage across the LED1 when the transceiver circuit 2004 is receiving data.

Figure 21A:
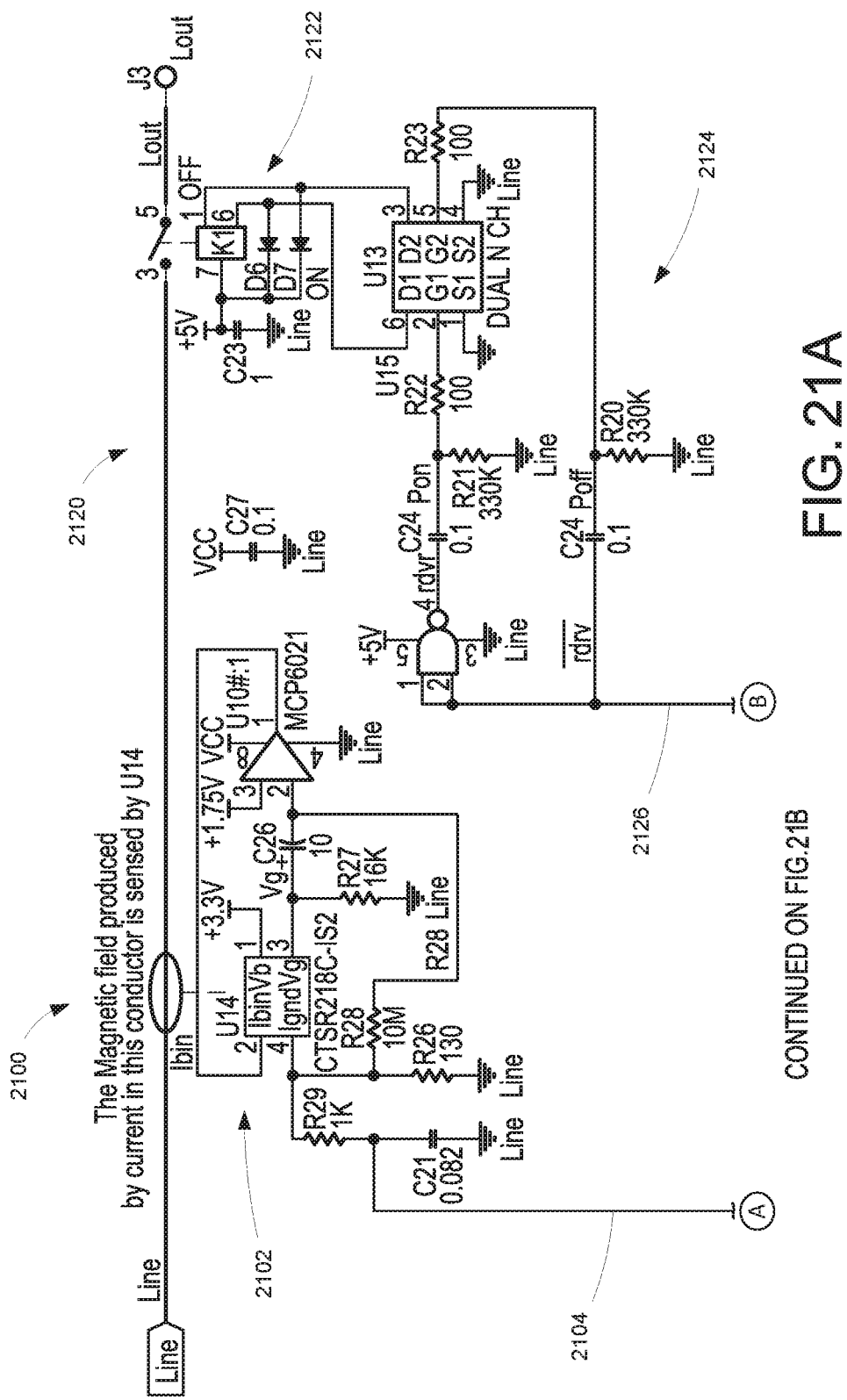
FIG. 21A is a circuit diagram illustrating an example of a current measurement circuit, in accordance with various aspects of the present disclosure.
Figure 21B:
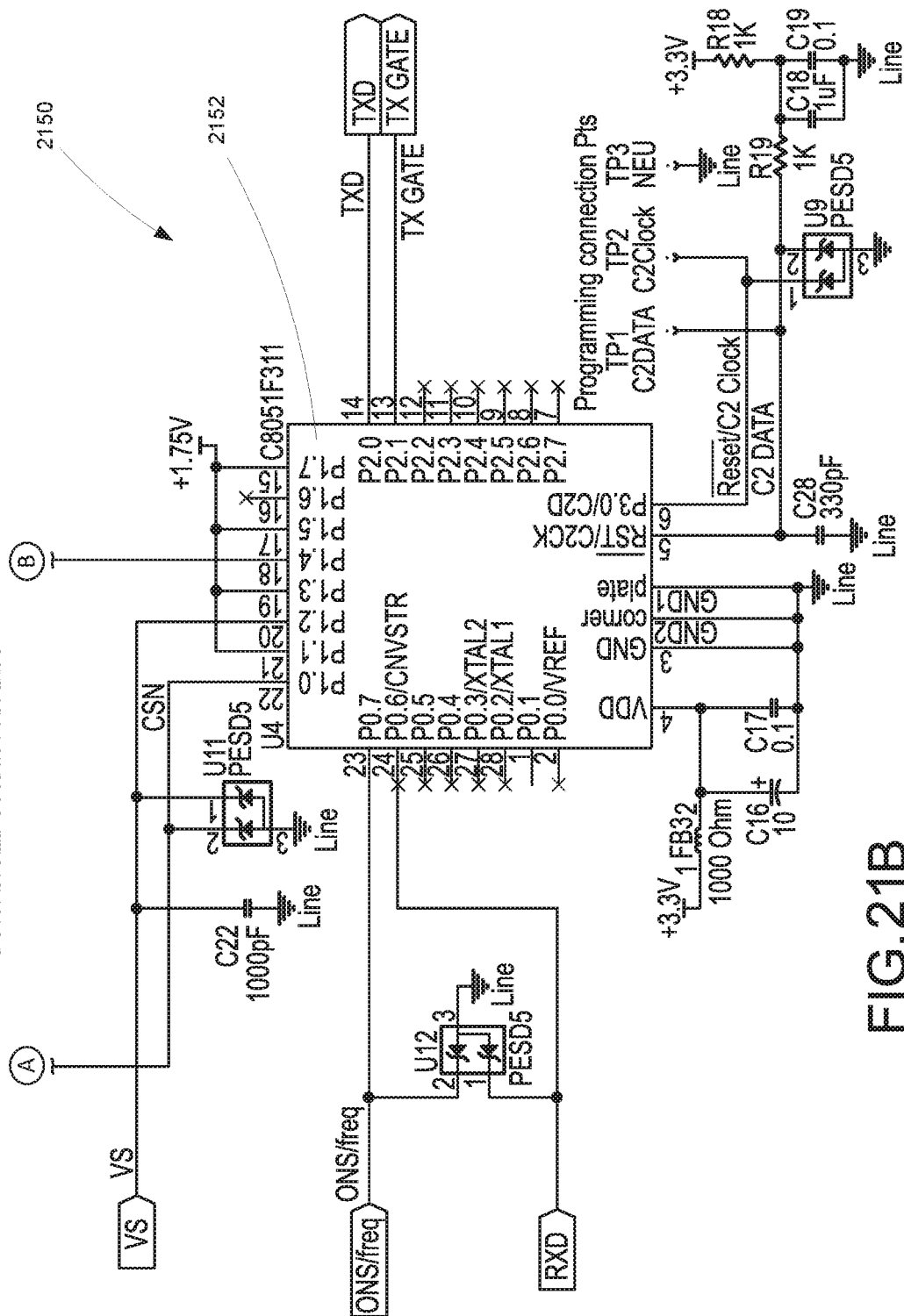
FIG. 21B is a circuit diagram illustrating an example of a control circuit, in accordance with various aspects of the present disclosure.

FIG. 21A is a circuit diagram illustrating an example of a current sensing circuit 2100 and a latching relay circuit 2120 of the smart cable 120, in accordance with a representative embodiment. The current sensing circuit 2100 includes a magneto-resistive sensor device 2102 for sensing the current flowing through a power output cord of a smart cable. In some embodiments, the magneto-resistive sensor device 2102 may be a magnetic tunnel junction (MTJ) sensor device, such as device part number CTSR218 manufactured by Crocus Technology. In some embodiments, the magneto-resistive sensor device 2102 may be encircled by ferrite shielding to mitigate interfering magnetic fields generated by nearby electronic or magnetic devices.

The magneto-resistive sensor device 2102 is configured to determine and/or otherwise measure the strength of a proximate alternating magnetic field that is associated with a power output cord of each smart cable. Based on the measured magnetic field, the current sensing circuit 2100 outputs a "current-sense" signal 2104 indicative of the current flowing through the power output cord of the smart cable. In some embodiments, the current sensing circuit 2100 may use other circuit configurations, such as those described in U.S. application Ser. No. 14/959,207, entitled "Magneto-Resistive Sensor Device and Magnetic Bias Regulator Circuit, Along With Systems And Methods Incorporating Same," filed on Dec. 4, 2015, which is incorporated by reference herein in its entirety.

The relay circuit 2120 includes a relay 2122 which controls the flow of current through a power output cord of a smart cable. The relay 2122 may be a basic electromagnetic relay, a latching relay, or other type of electronic switching device. The relay 2122 switches between a first state which allows current to flow through the power output cord, and a second state which prevents current from flowing through the power output cord. The state of the relay 2122 is controlled by a driver circuit 2124. The driver circuit 2124 receives a relay control signal 2126 from the microprocessor 2152. In response to the relay control signal 2126, the driver circuit 2124 provides one or more signals which control the state of the relay 2122.

Figure 22:
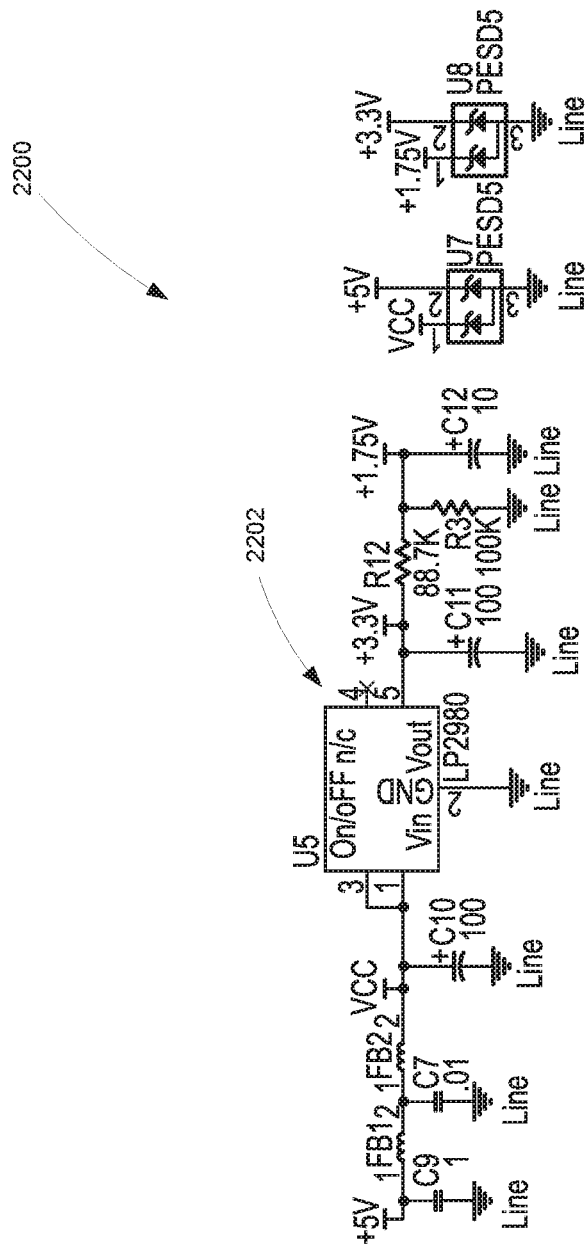
FIG. 22 is a circuit diagram illustrating an example of a voltage convertor circuit, in accordance with various aspects of the present disclosure.

With further reference to FIG. 21B and the microprocessor circuit 2150, the current sensing circuit 2100 provides current information (e.g., current-sense signal 2104) to the microprocessor 2152 and the microprocessor 2152 provides control signals (e.g., relay control signal 2126) to the latching relay circuit 2120. Accordingly, the microprocessor 2152 can control switching of line voltage to the output connector via the latching relay circuit 2120. FIG. 22 is a schematic diagram illustrating an example of a linear regulator circuit 2200, including a fixed-output voltage regulator 2202, operative to convert 5 volts to 3.3 volts to run the microprocessor 2152 (FIG. 21B).

Figure 23:
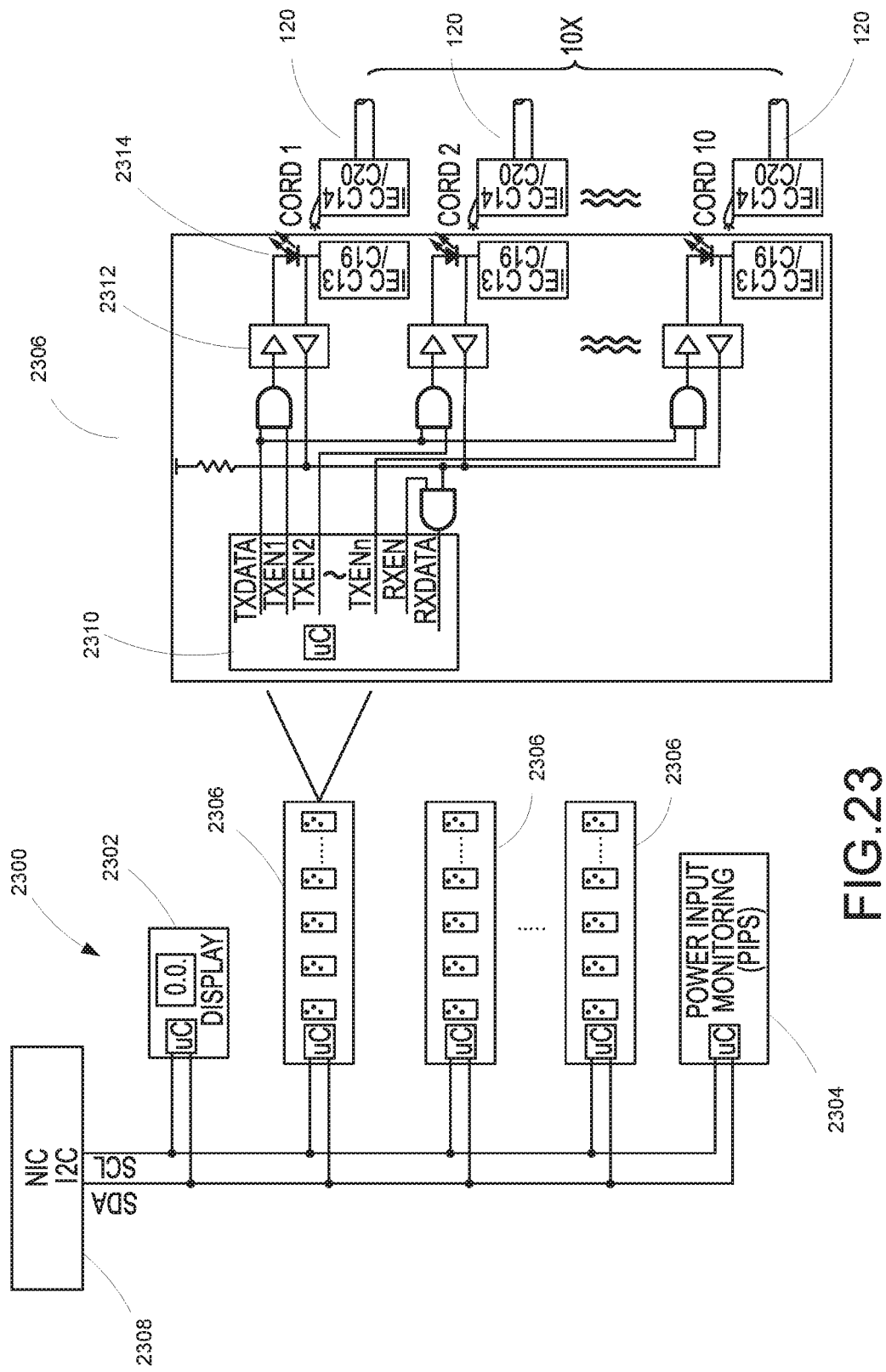
FIG. 23 is a circuit diagram illustrating an example of a PDU communication interface, in accordance with various aspects of the present disclosure.

FIG. 23 is a circuit diagram illustrating an example of a smart cable communication interface 2300 of the PDU 110, in accordance with various aspects of the present disclosure. The smart cable communication interface 2300 includes a display controller 2302 associated with the power metrics display 152 (FIG. 4A), a power input monitoring controller 2304, and a plurality of optical communication interface hubs 2306, all of which are connected to a network interface card (NIC) 2308. Each optical interface hub 2306 is operative to communicate with a plurality of smart cables 120 via each smart cable's optical communication circuit 2000, depicted as an IR interface (FIG. 20). Accordingly, the power-related parameters and unique identifier information associated with each smart cable 120 can be communicated to the PDU, which in turn can communicate that information to a network via the NIC 2308 and the communications interface 154 (FIG. 4). Each optical interface hub 2306 includes an aggregator 2310 comprised of a microcontroller operative to poll each of a plurality of transceivers 2312. The aggregator 2310 transmits information and commands to one cable at a time by activating a corresponding transmit enable output (e.g., TXEN1). Since only one cable will be responding, at a time, all of the receive circuits can be or'ed together. The output of the or'ed receive signals can be gated by the microprocessor, via the control signal (RXEN), so that the microprocessor is only allowed to monitor receive data when receive data is expected. This arrangement for the receive circuits simplifies the circuitry and reduces power consumption.

Each transceiver 2312 includes an IR LED 2314 positioned adjacent a corresponding outlet connector 160 such that when a smart cord 120 is connected to the outlet connector 160, the transceiver 2312 can communicate with the smart cord's PDU interface 280 (FIG. 18). In some embodiments, the transceivers 2312 can comprise circuitry similar to the IR communication circuit 2000 described above with respect to FIG. 20. Although the depicted embodiment comprises three optical interface hubs 2306 each having ten transceiver circuits 2312, other embodiments can have more or fewer optical interface hubs 2306 and/or transceiver circuits 2312.

It should be understood that various combinations of and modifications to the various disclosed embodiments are possible. For example, in some embodiments the power connector adaptors 116 and 118 could include a PDU interface 280, thereby making a smart adapter. Furthermore, the first and second connectors of the power connector adapters 116 and 118 could be separate connectors interconnected with a suitable power cord. These and other permutations and combinations are described below with respect to FIGS. 24A-25H, for example and without limitation.

FIG. 24A schematically represents the power connector adapter 116 described above with respect to FIG. 12. As shown, the power connector adapter 116 comprises a unitary body having a C13 connector at one end and a PDU connector mateable with an outlet connector 160 at the other end. FIG. 24B schematically represents the power connector adapter 118 described above with respect to FIG. 13. As shown, the power connector adapter 118 comprises a unitary body having a C19 connector at one end and a PDU connector at the other end. FIG. 24C schematically represents a power connector adapter 290 including a cable interconnecting a C13 connector and a PDU connector. The C13 and PDU connectors can be similar to those described herein. In some embodiments, the cable is a short, "pig-tail" cable, and in other various embodiments the cable can be one of many selected lengths. FIG. 24D schematically represents a power connector adapter 292 that is similar to power connector adapter 290 including a C19 connector instead of the C13 connector. In some embodiments, the power connector adapters 116 and 118 can comprise two or more mateable pieces or can be comprised of a single unitary construction.

Figure 25A:
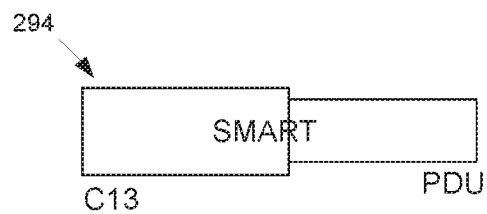
FIGS. 25A-25H diagrammatically illustrate various representative embodiments of smart cables and smart power connector adapters contemplated by the present disclosure.
Figure 25B:
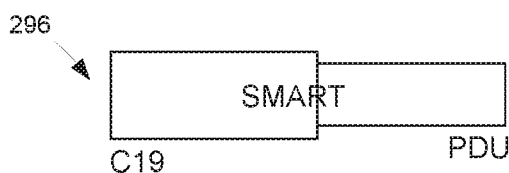
Figure 25C:
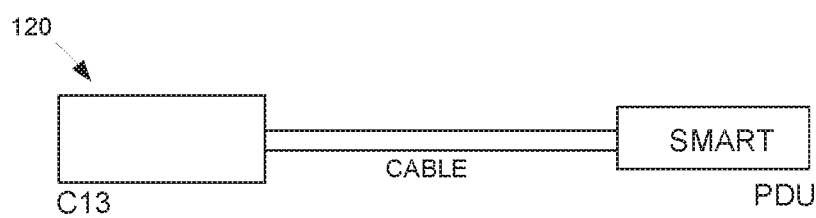
Figure 25D:
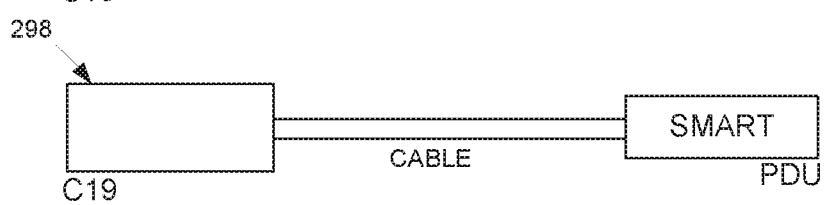
Figure 25E:
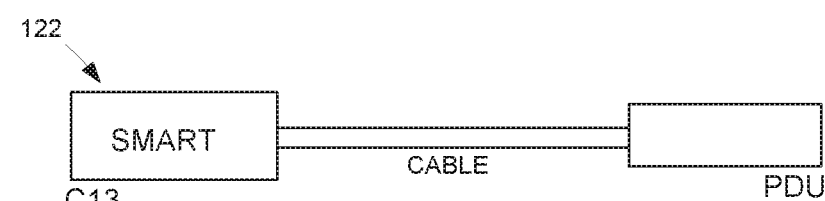
Figure 25F:
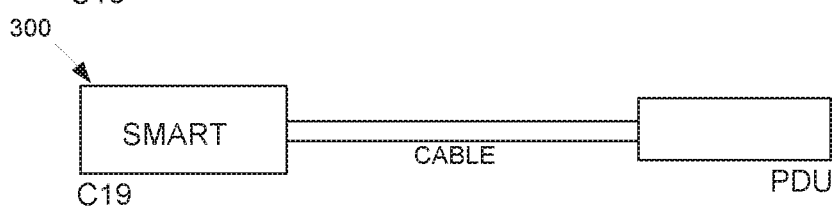
Figure 25G:
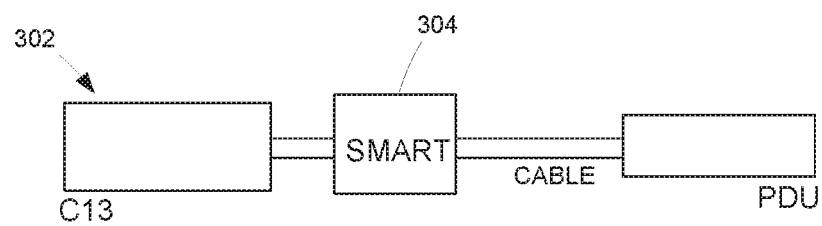
Figure 25H:
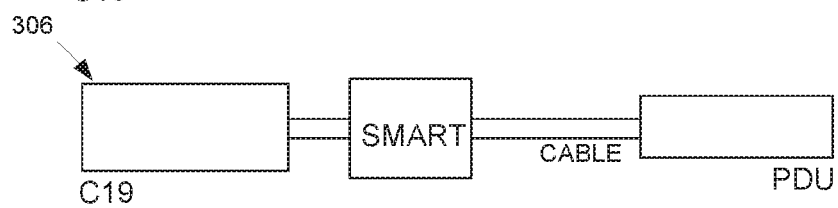

FIG. 25A schematically represents a smart power connector adapter 294 comprising a unitary body having a C13 connector at one end and a PDU connector mateable with an outlet connector 160 at the other end. The power connector adapter 294 also includes a PDU interface (SMART), such as PDU interface 280 (FIG. 18). FIG. 25B schematically represents a smart power connector adapter 296 that is similar to power connector adapter 294 including a C19 connector instead of the C13 connector. In some embodiments, the power connector adapters 294 and 296 can comprise two or more mateable pieces or can be comprised of a single unitary construction. FIG. 25C schematically represents the smart cable 120 described above with respect to FIGS. 3A and 17A. The smart cable 120 comprises a cable interconnecting a C13 connector and a PDU connector. The PDU connector includes the PDU interface (SMART) shown in FIG. 18. FIG. 25D schematically represents a smart cable 298 that is similar to smart cable 120 including a C19 connector instead of the C13 connector. FIG. 25E schematically represents the smart cable 122 described above with respect to FIG. 3B. The smart cable 122 is similar to smart cable 120 and includes a cable interconnecting a C13 connector and a PDU connector. However, the C13 connector includes the PDU interface (SMART) instead of the PDU connector. FIG. 25F schematically represents a smart cable 300 that is similar to smart cable 122 including a C19 connector instead of the C13 connector. FIG. 25G schematically represents a smart cable 302 comprising a cable interconnecting a C13 connector and a PDU connector. The smart cable 302 includes a housing 304 positioned between the C13 and PDU connectors and containing the PDU interface (SMART). FIG. 25H schematically represents a smart cable 306 that is similar to smart cable 302 including a C19 connector instead of the C13 connector.

In some embodiments, the smart cables 122 and 300 can include wired or optical communication cables extending from the C13 and C19 connectors along the cable to the PDU end of the cable for interfacing with the PDU's optical interface hub 2306 (FIG. 23). In some embodiments, the smart power connector adapters depicted in FIGS. 25A-25H can include wireless communication between the smart cable and the PDU.

Figure 26:
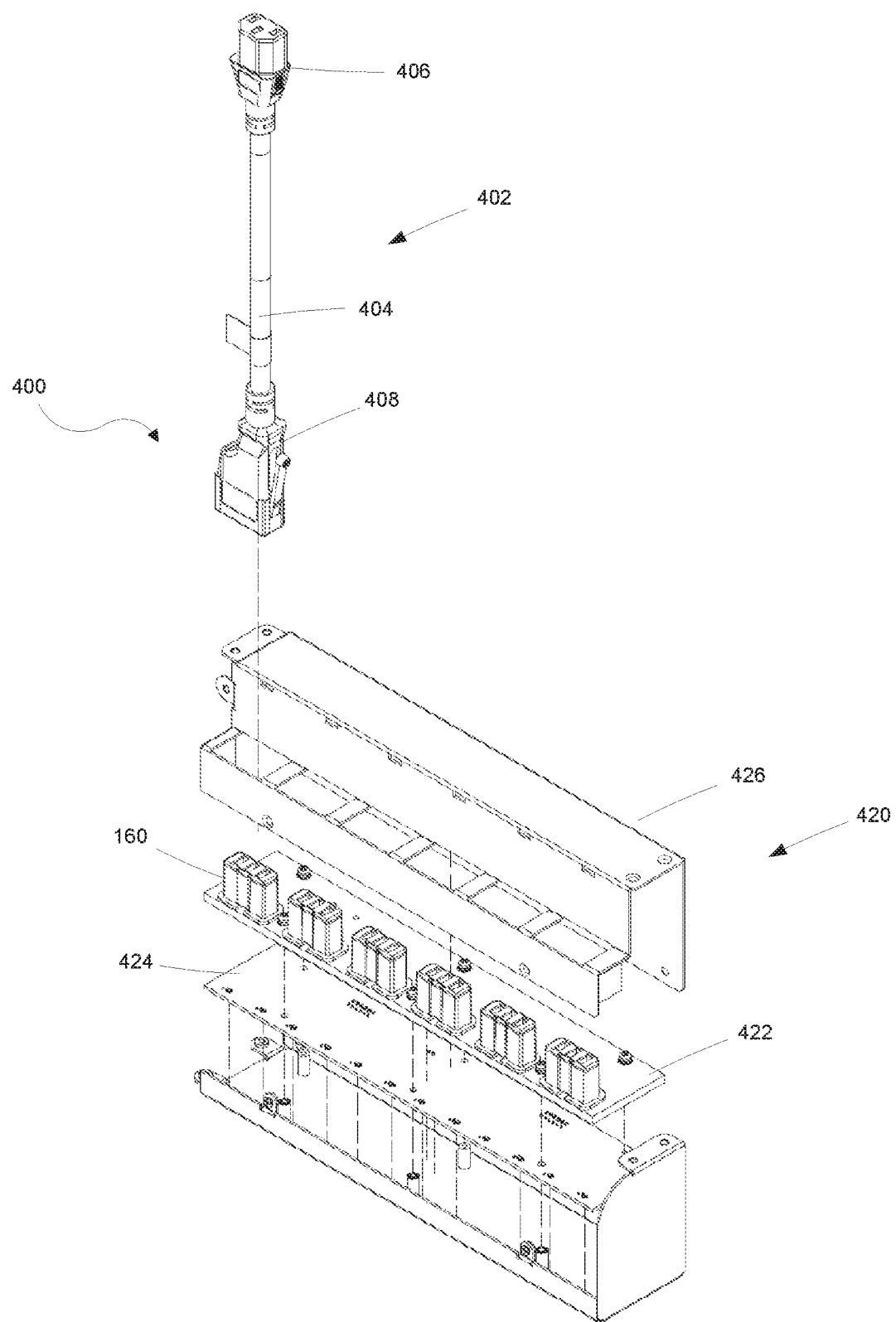
FIG. 26 is an exploded isometric view illustrating a cable identification system according to a representative embodiment.

FIGS. 26-29 illustrate a cable identification system 400 according to a representative embodiment. In some applications it is desirable to identify if and what type of cable 402 (e.g., C13, C19, and/or smart cable) is plugged into a PDU, such as PDU section 420. This information can be used to determine if a cable is present, if a piece of equipment is exceeding current limits for a particular cable and/or outlet, or if a smart cable has failed or lost power, for example. With reference to FIG. 26, cable 402 is a basic adapter cable (i.e., non-intelligent) having a PDU connector 408, a standard connector 406 (e.g., C13), and a cable 404 extending therebetween. The PDU section 420 is similar to a portion of PDU 110 described above and includes a buss board PCB 422 and a communication PCB 424 both contained in housing 426. The buss board PCB 422 supports a plurality of outlet connectors 160 that mate with PDU connector 408.

Figure 27:
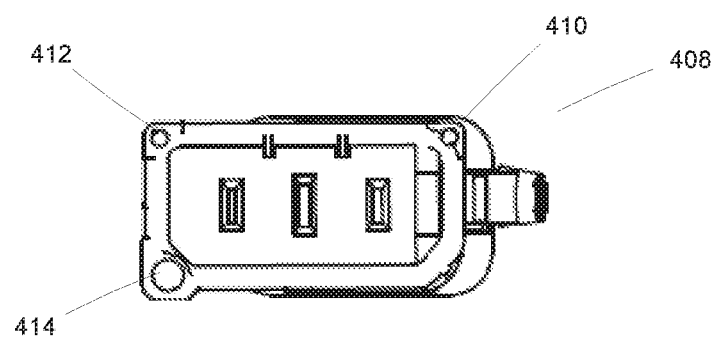
FIG. 27 is an end view of the PDU connector shown in FIG. 26.

As shown in FIG. 27, the PDU connector 408 can include first and second magnets 410 and 412, respectively. The presence or absence of these magnets can be used to determine the type of cable connected to the PDU. For example, the connector 408 can include only the first magnet 410, only the second magnet 412, both the first and second magnets 410 and 412, or no magnets to indicate that the cable is a C13, a C19, a smart cable, or that no cable is present, respectively. In the case of a smart cable, the PDU connector can also include an IR LED 414 to communicate with the PDU as explained above with respect to FIG. 23. In some embodiments, the magnets 410 and 412 can be cylindrical magnets comprising a suitable magnetic material such as neodymium, for example.

Figure 28:
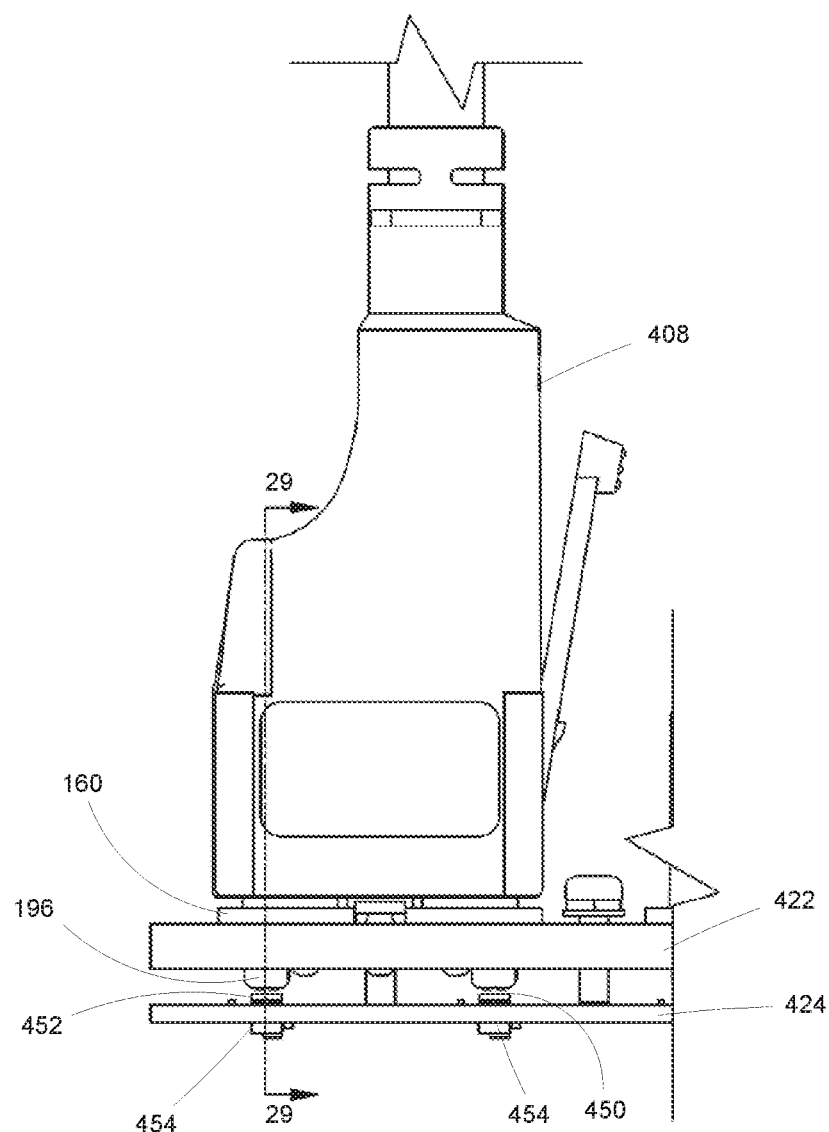
FIG. 28 is a side view in elevation of the cable identification system with the PDU connector connected to the outlet.
Figure 29:
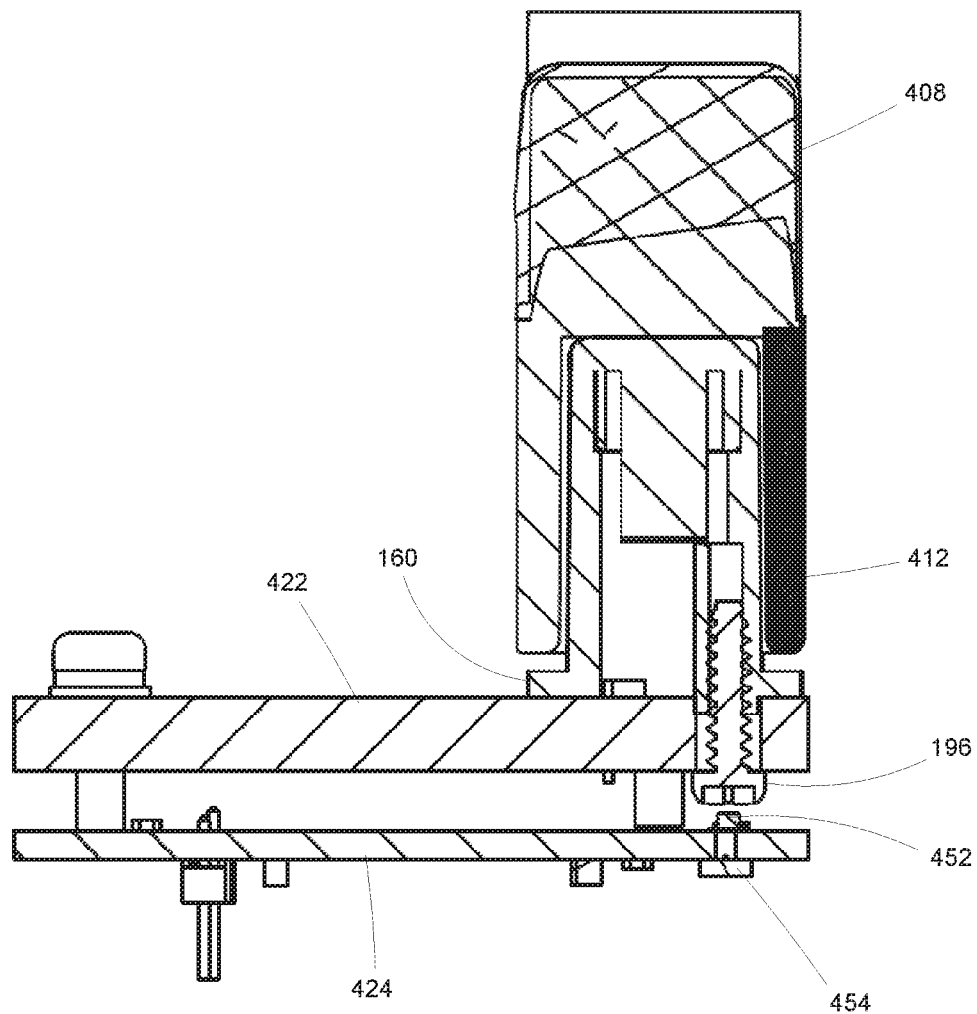
FIG. 29 is a cross-sectional view of the cable identification system as taken about line 29-29 in FIG. 28.

With further reference to FIGS. 28 and 29, the communication PCB 424 includes hall effect sensors, such as sensors 450 and 452 to detect which if any magnets are present, by sensing the magnetic field generated by either or both of the installed magnets, in a connector 408. Thus, the presence of and what type of cable can be determined based on which of the two hall effect sensors 450 and 452 detect a magnet. It should be appreciated that different numbers and positions of magnets can be located on the connector 408 in order to encode information pertaining to the cable.

In some embodiments, flux from the magnets, such as magnet 412, can be transferred to the corresponding hall effect sensor 452 through one of the outlet connector's mounting screws 196 (see also FIG. 11), which screw is used to mount the connector 160 to the buss board 422. In some embodiments, the flux transferred through screw 196 can be concentrated at the sensor 452 with a metal flux concentrator 454 positioned on the communication PCB 424 opposite the sensor 452. The flux concentrator 454 can significantly enhance the flux to the sensor, up to at least 35% in some cases. Directing the flux from magnet 412 with screw 196 and flux concentrator 454 allows the magnet to be relatively far away from the hall effect sensor 452 and still operate reliably.

Embodiments described herein provide several benefits relative to traditional PDUs. For example, various combinations of the PDU, adapters, and smart adapters disclosed herein allow users to configure outlets as C13 or C19, for example, on a per outlet and on an as needed basis. Also, switching, tracking, and power monitoring capabilities can be provided on an as needed per outlet basis using the disclosed smart cables and adapters. The 1 U spacing of outlets provided in a 2.2 inch wide chassis allows two PDUs to be mounted side-by-side in a rack such that two outlets are directly across from each rack unit. This arrangement simplifies cable management and lends itself to a user friendly, intuitive asset tracking solution. It will be noted that this list of various advantages is not exhaustive or exclusive, and numerous different advantages and efficiencies may be achieved, as will be recognized by one of skill in the art.

It should be noted that the systems, methods, and devices discussed above are intended merely to be examples. Other examples of smart cables can include a smart cable for removable attachment to a power distribution unit (PDU), comprising: a connector housing configured to removably connect the smart cable to a mateable interface of a PDU; a power output cable having a proximal end extending into the connector housing and a distal end coupled with an output connector that is configured to connect to electronic equipment; a PDU interface associated with the connector housing, the PDU interface including: a unique identifier encoded in a memory device; at least one sensing device configured to sense at least one power-related parameter of the power output cable; and at least one optical signal interface configured to report the at least one power-related parameter and the unique identifier to the PDU; and indicia corresponding to the unique identifier attached to the power output cable.

Other examples of power connector adapters can include a power connector adapter, comprising: a first connector configured to mate with an industry standard connector; a second connector configured to mate with a non-industry standard connector and including at least three aligned terminals; a plurality of conductors extending between the first connector and the second connector; a first attachment mechanism associated with the first connector; and a second attachment mechanism associated with the second connector and movable from a secured state, in which said attachment mechanism can retainably couple the power connector adapter to a PDU, to an unsecured state to allow removal of the power connector adapter from the PDU.

It must be stressed that various embodiments may omit, substitute, or add various procedures or components as appropriate. For instance, it should be appreciated that, in alternative embodiments, features described with respect to certain embodiments may be combined in various other embodiments. Different aspects and elements of the embodiments may be combined in a similar manner. Also, it should be emphasized that technology evolves and, thus, many of the elements are exemplary in nature and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, structures, and techniques have been shown without unnecessary detail in order to avoid obscuring the embodiments.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

We claim:

1. An adapter for interconnecting a power distribution unit (PDU) to electrical equipment, comprising:
   a first connector mateable with an outlet of the PDU;
   a second connector in electrical communication with said first connector, said second connector mateable with a power input of the electrical equipment; and
   PDU interface circuitry incorporating an optically isolated digital interface housed in the first connector for communicating one or more electrical parameters of the electrical equipment to the PDU when the first connector is mated with the outlet of the PDU.

2. An adapter according to claim 1 wherein said PDU interface circuitry comprises:
   memory storing a unique identifier associated with the electrical equipment;
   a tag having indicia corresponding to a unique identifier associated with the electrical equipment, and interrogation circuitry for reading said unique identifier.

3. An adapter according to claim 1 wherein said second connector comprises an electrical equipment connector housing, and wherein at least a portion of said PDU interface circuitry is disposed within said electrical equipment connector housing.

4. An adapter according to claim 1 wherein at least a portion of said PDU interface circuitry is in a housing that is positioned between said first connector and said second connector.

5. An adapter according to claim 1 further comprising a communication cable interconnecting said first connector to said second connector.

6. An adapter according to claim 5 wherein said communication cable is a wired cable.

7. An adapter according to claim 5 wherein said communication cable is an optical cable.

8. An adapter according to claim 1 wherein said second connector is one of an IEC C13 type connector and an IEC C19 type connector.

9. An adapter according to claim 1 wherein said first connector comprises three aligned terminals.

10. An adapter according to claim 1 wherein said first connector comprises a power connector adapter having a first end comprising three aligned terminals, and a second end configured to mate with an IEC C14 plug or an IEC C20 plug.

11. An adapter according to claim 10 wherein a portion of said first connector is configured as either an IEC C14 plug or and an IEC C20 plug which is removably connectable to said power connector adapter.

12. An adapter according to claim 1, wherein said PDU interface circuitry includes a power supply circuit to power the PDU interface.

13. An adapter according to claim 12, wherein said power supply circuit includes an offline power supply circuit that converts an incoming AC voltage to a DC voltage to power the PDU interface.

14. An adapter according to claim 13, wherein said PDU interface circuitry includes a relay circuit having a first state and a second state, the relay circuit switching between the first state and the second state to control a flow of current from the first connector to the second connector, the power supply circuit including an on-sense/frequency detection circuit to permit the relay to switch at low line voltage.

15. An adapter according to claim 1, wherein said PDU interface circuitry includes an optical interface circuit that comprises an infrared (IR) communication circuit having a two volt reference circuit, a transceiver circuit and a noise control circuit.

16. An adapter according to claim 1, wherein said adapter includes a power output cord and the PDU interface circuitry includes a current sensing circuit and a latching relay circuit, the current sensing circuit including a magneto-resistive sensor for sensing current through the power output cord, the latching relay circuit including a relay to control the flow of current through the output cord.

17. A power distribution system, comprising:
   a power distribution unit (PDU), comprising:
      a housing;
      an input adapted to receive input power from a power source;
      a plurality of outputs for provisioning power to electrical equipment; and
      a network interface; and
   at least one smart cable interconnecting said PDU to electrical equipment, said at least one smart cable adapter comprising:
      a first connector mated with at least one of said outputs;
      a second connector in electrical communication with said first connector via a power output cable, said second connector mateable with a power input of the electrical equipment; and
      at least one PDU interface circuit comprising an optically isolated digital interface housed in the first connector for communicating power related parameters of the electrical equipment to the PDU when the first connector is mated with the at least one output of the PDU.

18. A power distribution system according to claim 17 wherein at least one of said outputs of the PDU comprises three aligned apertures, and wherein said first connector is configured to mate with said three aligned apertures.

19. A power distribution system according to claim 18 wherein the first connector of said smart cable adapter comprises a power connector adapter having a first end comprising three aligned apertures.

20. A power distribution system according to claim 17 wherein said PDU comprises at least one smart cable interface operative to communicate with the at least one PDU interface circuit of said at least one smart cable adapter such that power-related parameters of said at least one smart cable adapter can be communicated to said PDU, and from said PDU, over a network via said network interface.

21. A power distribution system according to claim 20 wherein said least one smart cable interface circuitry includes at least one optical communication interface hub interconnected to said network interface.

22. A power distribution system according to claim 20 wherein said smart cable adapter comprises a selected number of magnets to indicate a configuration type of said smart cable adapter, and wherein said PDU includes at least a corresponding number of sensors for detecting a presence or an absence of said selected number of magnets.

23. An adapter according to claim 1 wherein said PDU interface circuitry further comprises a memory device configured to store a unique identifier associated with the electrical equipment and wherein the PDU interface circuitry communicates the unique identifier to the PDU.

24. A power distribution system according to claim 17 wherein said PDU interface circuit further comprises a memory device configured to store a unique identifier associated with the electrical equipment and wherein the PDU interface circuitry communicates the unique identifier to the PDU.

25. A power distribution system according to claim 17, wherein said PDU interface circuit includes a power supply circuit to power the PDU interface circuit.

26. A power distribution system according to claim 25, wherein said power supply circuit includes an offline power supply circuit that converts an incoming AC voltage to a DC voltage to power the PDU interface.

27. A power distribution system according to claim 26, wherein said PDU interface circuit includes a relay circuit having a first state and a second state, the relay circuit switching between the first state and the second state to control the flow of current through the power output cable, the power supply circuit including an on-sense/frequency detection circuit to permit the relay to switch at low line voltage.

28. A power distribution system according to claim 17, wherein said at least one smart cable adapter includes a plurality of smart cable adapters each having an optical interface circuit, the PDU including a smart cable communication interface in communication with the network interface, the smart cable communication interface having a display controller, a power metric display associated with the display controller, a power input monitoring controller and a plurality of optical communication interface hubs in communication with the plurality of smart cable adapters via the optical interface circuits.

* * * * *

UNITED STATES PATENT AND TRADEMARK OFFICE
CERTIFICATE OF CORRECTION

PATENT NO. : 11,095,081 B2  
APPLICATION NO. : 16/356646  
DATED : August 17, 2021  
INVENTOR(S) : Travis Irons et al.

Page 1 of 1

It is certified that error appears in the above-identified patent and that said Letters Patent is hereby corrected as shown below:

In the Specification

In Column 10, Line 54, delete "$W_O$" and insert -- $W_o$ --.

In Column 10, Line 56, delete "$W_O$" and insert -- $W_o$ --.

In Column 11, Line 6, delete "4.)" and insert -- 4) --.

In the Claims

In Column 22, Line 59, in Claim 21, after "said" insert -- at --.

Signed and Sealed this  
Twelfth Day of April, 2022

Drew Hirshfeld  
*Performing the Functions and Duties of the*  
*Under Secretary of Commerce for Intellectual Property and*  
*Director of the United States Patent and Trademark Office*